(12) United States Patent
Poddar et al.

(10) Patent No.: US 9,088,369 B2
(45) Date of Patent: Jul. 21, 2015

(54) SELF INJECTION LOCKED PHASE LOCKED LOOPED OPTOELECTRONIC OSCILLATOR

(71) Applicant: Synergy Microwave Corporation, Paterson, NJ (US)

(72) Inventors: Ajay Kumar Poddar, Elmwood Park, NJ (US); Ulrich L. Rohde, Upper Saddle River, NJ (US); Afshin S. Daryoush, Bryn Mawr, PA (US)

(73) Assignee: Synergy Microwave Corporation, Paterson, NJ (US)

( * ) Notice: Subject to any disclaimer, the term of this patent is extended or adjusted under 35 U.S.C. 154(b) by 133 days.

(21) Appl. No.: 13/760,767

(22) Filed: Feb. 6, 2013

(65) Prior Publication Data

US 2014/0186045 A1    Jul. 3, 2014

Related U.S. Application Data

(60) Provisional application No. 61/746,919, filed on Dec. 28, 2012.

(51) Int. Cl.
*H04B 10/00* (2013.01)
*H04B 10/508* (2013.01)
(Continued)

(52) U.S. Cl.
CPC .............. *H04B 10/508* (2013.01); *H03B 17/00* (2013.01); *H03L 7/00* (2013.01); *H04B 10/2575* (2013.01);
(Continued)

(58) Field of Classification Search
CPC . H04B 10/255; H04B 10/2575; H04B 10/548
USPC .................................................. 398/115, 116
See application file for complete search history.

(56) References Cited

U.S. PATENT DOCUMENTS

| 4,048,580 A | 9/1977 | Campbell et al. |
| 4,336,505 A | 6/1982 | Meyer |

(Continued)

FOREIGN PATENT DOCUMENTS

| EP | 1600806 A2 | 11/2005 |
| EP | 2144370 A1 | 1/2010 |

(Continued)

OTHER PUBLICATIONS

Bánky et al., "Calculations for the measure of the achievable phase noise reduction by the utilization of optimized multiloop opto-electronic oscillators", 2005.

(Continued)

*Primary Examiner* — Dzung Tran
(74) *Attorney, Agent, or Firm* — Lerner, David, Littenberg, Krumholz & Mentlik, LLP

(57) ABSTRACT

Aspects of the disclosure relate generally to a circuit for sustaining an radio frequency (RF) modulated optical signal. The circuit may comprise a self injection locking component having a fiber optic delay line over which a portion of the optical signal propagates. The circuit may also comprise a self phase locked loop component having at least two fiber optic cables having different lengths and over which another portion of the optical signal propagates and a phase detector coupled to the at least two fiber optic cables and configured to determine a phase difference between the signals propagating over one of the respective fiber optic cables. The circuit may further comprise a voltage controlled oscillator configured to generate a stable oscillating signal in response to signals generated by each of the self injection locking and self phase locked loop components, the stable oscillating signal being configured to sustain the optical signal.

44 Claims, 19 Drawing Sheets

(51) Int. Cl.
| | |
|---|---|
| H03L 7/00 | (2006.01) |
| H03B 17/00 | (2006.01) |
| H04B 10/2575 | (2013.01) |
| H04L 7/00 | (2006.01) |
| H04L 7/033 | (2006.01) |
| H01S 3/11 | (2006.01) |
| H01S 3/30 | (2006.01) |

(52) U.S. Cl.
CPC ............ *H04L 7/0037* (2013.01); *H04L 7/0041* (2013.01); *H04L 7/033* (2013.01); *H04L 7/0337* (2013.01); *H01S 3/11* (2013.01); *H01S 3/1109* (2013.01); *H01S 3/302* (2013.01); *H04B 2210/006* (2013.01)

(56) References Cited

U.S. PATENT DOCUMENTS

| | | |
|---|---|---|
| 4,980,891 A | 12/1990 | Izadpanah |
| 5,204,640 A | 4/1993 | Logan, Jr. |
| 5,220,292 A | 6/1993 | Bianchini et al. |
| 5,379,309 A | 1/1995 | Logan, Jr. |
| 5,396,166 A | 3/1995 | Vohra et al. |
| 5,457,559 A | 10/1995 | Saito et al. |
| 5,687,261 A | 11/1997 | Logan |
| 5,706,113 A | 1/1998 | Kawanishi et al. |
| 5,777,778 A | 7/1998 | Yao |
| 5,917,179 A | 6/1999 | Yao |
| 5,929,430 A | 7/1999 | Yao et al. |
| 6,580,532 B1 | 6/2003 | Yao et al. |
| 6,594,061 B2 | 7/2003 | Huang et al. |
| 6,873,631 B2 | 3/2005 | Yao et al. |
| 6,891,149 B1 | 5/2005 | Lewis et al. |
| 7,027,675 B2 | 4/2006 | Sayyah |
| 7,068,411 B2 | 6/2006 | Dorrer et al. |
| 7,088,189 B2 | 8/2006 | Rohde et al. |
| 7,151,415 B1 | 12/2006 | Zhou |
| 7,173,749 B2 | 2/2007 | Maleki et al. |
| 7,180,381 B2 | 2/2007 | Rohde et al. |
| 7,460,746 B2 | 12/2008 | Maleki et al. |
| 8,111,722 B1 | 2/2012 | Maleki et al. |
| 8,121,475 B2 | 2/2012 | Kagawa |
| 8,159,736 B2 | 4/2012 | Maleki et al. |
| 2002/0181041 A1 | 12/2002 | Tong |
| 2003/0090777 A1 | 5/2003 | Yap |
| 2004/0101317 A1* | 5/2004 | Yap et al. ............. 398/187 |
| 2004/0264977 A1 | 12/2004 | Yap et al. |
| 2005/0127402 A1 | 6/2005 | Dybsetter et al. |
| 2005/0185681 A1* | 8/2005 | Ilchenko et al. .......... 372/20 |
| 2005/0281193 A1 | 12/2005 | Hofmeister et al. |
| 2006/0239695 A1 | 10/2006 | Sayyah |
| 2008/0080870 A1 | 4/2008 | Tsuji |
| 2011/0292486 A1 | 12/2011 | Delfyett et al. |
| 2012/0224865 A1 | 9/2012 | Brown |
| 2012/0294319 A1* | 11/2012 | Maleki et al. ............ 372/18 |
| 2013/0287065 A1* | 10/2013 | Sun et al. ............ 375/146 |
| 2014/0186045 A1 | 7/2014 | Poddar et al. |

FOREIGN PATENT DOCUMENTS

| | | |
|---|---|---|
| WO | 03088472 A2 | 10/2003 |
| WO | 2004077675 A2 | 9/2004 |
| WO | 2005017607 A2 | 2/2005 |

OTHER PUBLICATIONS

Capmany et al., "High-Q microwave photonic filter with a tuned modulator", Optics letters, vol. 30, No. 17, Sep. 1, 2005, pp. 2299-2301.

Chang et al., "Phase Noise in Self-Injection-Locked Oscillators—Theory and Experiment", IEEE Transactions on Microwave Theory and Techniques, vol. 51, No. 9, Sep. 2003, pp. 1994-1999.

Daryoush et al., "Performance Evaluation of Opto-Electronic Oscillators Employing Photonic Crystal Fibers", Proceedings of the 36th European Microwave Conference, Sep. 2006, Manchester, UK, pp. 1111-1114.

Devgan et al., "Improvement in the Phase Noise of a 10 GHz Optoelectronic Oscillator Using All-Photonic Gain", Journal of Lightwave Technology, vol. 27, No. 15, Aug. 1, 2009, pp. 3189-3193.

Dijk et al., "Optimization of a 54.8 GHz Coupled Opto-Electronic Oscillator through Dispersion Compensation of a mode-locked semiconductor laser", IEEE © 2008, pp. 279-282.

Dijk et al., "Phase Noise Reduction of a Quantum Dash Mode-Locked Laser in a Millimeter-Wave Coupled Opto-Electronic Oscillator", Journal of Lightwave Technology, vol. 26, No. 15, Aug. 1, 2008, pp. 2789-2794.

Docherty et al., "Theoretical Investigation of Optical Fiber-Length-Dependent Phase Noise in Opto-Electronic Oscillators", 2011.

Eliyahu et al., "Modulation Response (S21) of the Coupled Opto-Electronic Oscillator", IEEE © 2005, pp. 850-856.

Eliyahu et al., "Improving short and long term frequency stability of the opto-electronic oscilaltor", 2002 IEEE International Frequency Control Symposium and PDA Exhibition, pp. 580-583.

Eliyahu et al., "Low Phase Noise and Spurious Level in Multi-Loop Opto-Electronic Oscillators", Proceedings of the 2003 IEEE International Frequency Control Symposium and PDA Echibition Jointly with the 17th European Frequency and Time Forum, pp. 405-410.

Eliyahu et al., "Phase Noise of a High Performance OEO and an Ultra Low Noise Floor-Cross-Correlation Microwave Photonic Homodyne System", IEEE © 2008, pp. 811-814.

Eliyahu et al., "RF Amplitude and Phase-Noise Reduction of an Optical Link and an Opto-Electronic Oscillator", IEEE Transactions on Microwave Theory and Techniques, vol. 56, No. 2, Feb. 2008, pp. 449-456.

Eliyahu et al., "Tunable, Ultra-Low Phase Noise YIG Based Opto-Electronic Oscillator", 2003 IEEE MTS-S Digest, pp. 2185-2187.

Fedderwitz et al., "Opto-Electronic Dual-Loop 50 GHz Oscillator with Wide Tunability and Low Phase Noise", IEEE © 2010, 3 pages.

Fuochi et al., "Study of Raman Amplification Properties in Triangular Photonic Crystal Fibers", Journal of Lightwave Technology, vol. 21, No. 10, Oct. 2003, pp. 2247-2254.

Hansen et al., "Solid-Core Photonic Bandgap Fiber with Large Anormalous Dispersion", Friday Morning, vol. 2/OFC 2003, pp. 700-701.

International Search Report and Written Opinion for Application No. PCT/US2013/076975 dated Apr. 25, 2014.

International Search Report and Written Opinion for Application No. PCT/US2014/017058 dated Jul. 25, 2014.

Kaba et al., "Improving Thermal Stability of Opto-Electronic Oscillators", IEEE Microwave Magazine, Aug. 2006, pp. 38-47.

Kotb et al., "Tuning of an RF Optoelectronic Oscillator", 2006.

Lee et al., "Detailed Theoretical and Experimental Study on Single Passband, Photonic Microwave FIR Filter Using Digital Micromirror Device and Continuous-Wave Supercontinuum", Jornal of Lightwave Technology, vol. 26, No. 15, Aug. 1, 2008, pp. 2619-2628.

Lee et al., "A 30-GHz Self-Injection-Locked Oscillator Having a Long Optical Delay Line for Phase-Noise Reduction", IEEE Photonics Technology Letters, vol. 9, No. 24, Dec. 15, 2007, pp. 1982-1984.

Lee et. al., "Low-Cost Optoelectronic Self-Injection-Locked Oscillators", IEEE Photonics Technology Letters, vol. 20, No. 13, Jul. 1, 2008, pp. 1151-1153.

Li et al., "Tunable Optoelectronic Oscillator Incorporating a High-Q Spectrum-Sliced Photonic Microwave Transversal Filter", IEEE Photonics Technology Letters, vol. 24, No. 14, Jul. 15, 2012, pp. 1251-1253.

Logan et al., "Forty-fifth annual symposium on frequency control", IEEE, © 1991, pp. 508-512.

Logan et al., "Ultra-Stable Microwave and Millimeter Wave Photonic Oscillators", 1992 IEEE Frequency Control Symposium, pp. 420-424.

Lynch et al., "A Mode Locked Array of Coupled Phase Locked Loops", IEEE Microwave and Guided Wave Letters, vol. 5, No. 7, Jul. 1995, pp. 213-215.

Lynch et al., "Stability of Mode Locked States of Coupled Oscillator Arrays", IEEE Transactions on Circuits and Systems-1: Fundamental Theory and Applications, vol. 42, No. 8, Aug. 1995, pp. 413-418.

(56) References Cited

OTHER PUBLICATIONS

Menyuk et al., An analytical model of the dual-injection-locked opto-electronic oscillator (DIL-OEO), IEEE, © 2009, pp. 870-874.
Nelson et al., "Microwave Optoelectronic Oscillator with Optical Gain", IEEE © 2007, pp. 1014-1019.
Okusaga et al., "Investigating the forward and backward injections of injection-locked dual optoelectronic oscillators", OSA/OFC/NFOEC 2009.
Ozdur et al., "Low Noise Optically Tunable Opto-Electronic Oscillator with Fabry-Perot Etalon", Journal of Lightwave Technology, vol. 28, No. 21, Nov. 1, 2010, pp. 3100-3106.
Pillet et al., "Dual-frequency laser at 1.5 mm for optical distribution and generation of high-purity microwave signals", Journal of Lightwave Technology, vol. 26, No. 15, Aug. 1, 2008, pp. 2764-2773.
Pillet et al., "Self-stabilization of the beatnote of a 1.5 mm dual-frequency laser", IEEE, © 2008, pp. 291-294.
Plessas et al., "A 5-GHz Injection-Locked Phase-Locked Loop", Microwave and Optical Technology Letters, vol. 46, No. 1, Jul. 5, 2005, pp. 80-84.
Ronald T Logan et al: "Forty-Fifth Annual Symposium on Frequency Control Stabilization of Oscillator Phase Using a Fiber-Optic Delay-Line", Forty Fifth Annual Symposium on Frequency Control, May 29, 1991, XP055129532.
Saitoh et al., "Hollow-Core Photonic Bandgap Fibers with Broadband Negative Dispersion Slope", OSA/CLEO/IQEC 2009, 2 pages.
Salik et al., "An Ultralow Phase Noise Coupled Optoelectronic Oscillator", IEEE Photonics Technology Letters, vol. 19, No. 6, Mar. 15, 2007, pp. 444-446.
Savchenkov et al., "Tunable optical single-sideband modulator with complete sideband suppression", Optics Letters, vol. 34, No. 9, May 1, 2009, pp. 1300-1302.
Savchenkov et al., "Whispering-Gallery Mode Based Opto-Electronic Oscillators", IEEE © 2010, pp. 554-557.
Sturzebecker, Dana L., "Optically controlled oscillators for millimeter-wave phased-array antennas", IEEE Transactions on Microwave Theory and Techniques, vol. 41, No. 6/7, Jun./Jul. 1993, pp. 908-1004.
Volyanskiy et al., "Compact optoelectronic microwave oscillators using ultra-high Q whispering gallery mode disk-resonators and phase modulation", Optics Express, vol. 18, No. 21, Oct. 11, 2010.
Volyanskiy et al., "Contribution of Laser Frequency and Power Fluctuations to the Microwave Phase Noise of Optoelectronic Oscillators", Journal of Lightwave Technology, vol. 28, No. 18, Sep. 15, 2010, pp. 2730-2735.
Várallyay et al., "Photonic Crystal Fibre for Dispersion Controll", Frontiers in Guided Wave Optics and Optoelectronics, Bishnu Pal (Ed.), ISBN:978-953-7619-82-4, In Tech, Feb. 2010, Available from: <http://www.intechopen.com/books/frontiers-in-guided-wave-optics-and optoelectronics/photonic-crystal-fibre-for-dispersion-controll>.
Williams et al., "Noise Characterization of an Injection-Locked COEO With Long-Term Stabilization", Journal of Lightwave Technology, vol. 29, No. 19, Oct. 1, 2011, pp. 2906-2912.
Yao et al., "Dual microwave and optical oscillator", Optics Letters, Vo. 22, No. 24, Dec. 15, 1997, pp. 1867-1869.
Yao et al., "A Light-Induced Microwave Oscillator" TDA Progress Report 42-123, Nov. 15, 1995, pp. 47-68.
Yao et al., "Converting light into spectrally pure microwave oscillation", Optics Letters, vol. 21, No. 7, Apr. 1, 1996, pp. 483-485.
Yao et al., "Coupled OptoelectronicOscillators for Generating Both RF Signal and Optical Pulses", Journal of Lighwave TEchnology, vol. 18, No. 1, Jan. 2000, pp. 73-78.
Yao et al., "High frequency optical subcarrier generator", Electronics Letters, vol. 30, No. 18, Sep. 1, 1994, pp. 1525-1526.
Yao et al., "Multiloop Optoelectronic Oscillator", IEEE Journal of Quantum Electronics, Vo. 36, No. 1, Jan. 2000, pp. 79-84.
Yao et al., "Optoelectronic Oscillator for Photonic Systems", IEEE Journal of Quantum Electronics, vol. 32, No. 7, Jul. 1996, pp. 1141-1149.
Yi, Ni, "Large Negative Dispersion in Square Solid-Core Photonic Bandgap Fibers", IEEE Journal of Quantum Electronics, vol. 41, No. 5, May 2005, pp. 666-670.
York et al., "Coupled-Oscillator Arrays for Millimeter-Wave Power-Combining and Mode-Locking", IEEE MTS-S Digest, 1992, pp. 429-432.
York et al., "Mode-Locked Oscillator Arrays", IEEE Microwave and Guided Wave Letters, vol. 1, No. 8, Aug. 1991, pp. 215-218.
Yu et al., "Ultralow-noise mode-locked laser with coupled optoelectronic oscillator configuration", Optics Letters, vol. 30, No. 10, May 15, 2005, pp. 1231-1233.

\* cited by examiner

| Phase Noise of 4km OEO @ 10kHz Offset (dBc/Hz) | | Q Enhancement |
|---|---|---|
| α=0.3dB/km | -140 | 0dB |
| α=0.2dB/km | -141 | 0.6dB |
| α=0.1dB/km | -143 | 1.5dB |
| α=0.05dB/km | -148 | 4dB |

FIG. 3

SELF INJECTION LOCKED PHASE LOCKED LOOPED OPTOELECTRONIC OSCILLATOR

CROSS-REFERENCE TO RELATED APPLICATIONS

The present application claims the benefit of the filing date of U.S. Provisional Patent Application No. 61/746,919 filed Dec. 28, 2012, the disclosure of which is hereby incorporated herein by reference.

BACKGROUND

This disclosure is directed to a system and method for controlling an optoelectronic oscillator ("OEO"). In a preferred embodiment, the OEO is capable of producing repetitive electronic sine or any arbitrary wave and/or electrically modulated continuous wave or pulsed optical signals.

OEOs are an optical and electronic hybrid device and use optical modulation to produce electrical output oscillations in RF and microwave frequencies that can exhibit narrow spectral line widths and ultra low phase noise in comparison with the conventional RF and microwave signal sources. Optical resonators intrinsically can support variation of resonant modes of light called whispery gallery modes (WGMs), hence many oscillation modes can be sustained in an OEO so long the gain of active regenerative feedback loop compensates and exceeds the loop looses.

Generally, optoelectronic oscillators receive pump continuous energy from an optical source, such as a laser, in addition to energy in the form of direct current (DC) power from a power supply. The energy is converted into radio frequency (RF) and microwave signals based on a filtering mechanism. Optoelectronic oscillators typically experience a low loss, low temperature sensitivity, and can be achieved at a relatively small size, as compared to conventional electronic delay elements of similar delay times. These benefits often lead to a high quality factor and greater stability for the optoelectronic oscillators in both the short term and the long term, as compared to electronic oscillators.

An optoelectronic oscillator generally utilizes a modulator, such as an optical modulator, to convert continuous wave light energy from the laser into a modulated stable, spectrally pure optical signal (e.g., RF signal, microwave signal). Energy from the laser passes through the modulator and then fed back to itself. First, the optical signal passes through a delay line (e.g., a fiber optic cable). The optical signal traveling through the delay line is then detected by a photodetector and converted to an electrical signal. The electrical output of the photodetector is amplified, filtered, and fed back to the modulator in a closed loop. This configuration supports self-sustained oscillations, provided that the electrical feedback signal fed to the modulator meets certain oscillation conditions in terms of its amplitude and phase. The frequency of the optoelectronic oscillator's output is controlled by several factors, such as, the fiber delay length, the operating condition of the modulator, and the band pass characteristics of the filter used to filter the oscillating signal.

An important aspect of sustaining a pure sinusoidal oscillating signal in any oscillator is filtering the sustaining signal from the surrounding sources that contribute to close-in to carrier phase noise. Phase noise reduction may be accomplished in one of several ways.

Some optoelectronic oscillators reduce phase noise by forcing oscillations using injection-locking (IL). In an injection-locked oscillator, a stable master oscillator pulls a less stable slave oscillator to a harmonic frequency of the master oscillator, within a range of detuning frequencies known as the frequency locking range. Pulling the frequency of the slave oscillator to that of the master oscillator reduces the slave oscillator's frequency variations within the frequency locking range, thereby also reducing phase noise of the slave oscillator within the frequency locking range.

Other optoelectronic oscillators reduce phase noise using a phase locked loop (PLL). In a PLL oscillator, the phase of a reference signal (e.g., a master signal from an OEO) is compared to the phase of the oscillator's signal using a phase comparator. The difference between the phase of each the reference signal and the oscillator is used to generate a phase error output, which is a variable signal used to correct deviations in the phase and/or frequency of the slave oscillator.

While the currently known advances in phase noise reduction are effective at raising the quality factor and increasing stability for oscillators, these advances alone do not provide a stable enough signal to satisfy some oscillator applications in both current and future technology. For example, cellular systems (e.g., broadband MIMO, UWB, 4G LTE, etc.) rely on fitting an ever increasing amount of data into a limited bandwidth that gets even more crowded over time. In order to fit this data into such bandwidth, it is preferable that the frequency at which the data is transmitted is kept to as narrow a bandwidth as possible. Additionally, it is preferable that the frequency at which such data is transmitted is locked as precisely as possible, and that unwanted shifts in the frequency and phase are kept to a minimum.

Each of IL and PLL noise reduction does not achieve a sufficiently stable signal to accommodate the continuously increasing demand to fit more and more data over a limited bandwidth. As a result, there is a need for an optoelectronic oscillator having a further improved quality factor, further reduced phase noise, and (as a result) increased stability.

SUMMARY OF THE INVENTION

One aspect of the disclosure provides an opto-electronic oscillation circuit for sustaining an oscillating optical signal. The opto-electronic oscillation circuit may include a self injection locking component configured to receive a first portion of the oscillating optical signal, and further comprising a fiber optic delay line over which the optical signal propagates. The opto-electronic oscillation circuit may also include a self phase locked loop component configured to receive a second portion of the optical signal. The self phase locked loop component may further include at least two fiber optic cables over which the optical signal propagates, and at least one phase detector coupled to the fiber optic cables and configured to determine a difference in phase between a signal propagating over one of the fiber optic cables and a signal propagating over another of the fiber optic cables. The two fiber optic cables may have different lengths. At least one of the fiber optic cables may be a fiber optic delay line. The circuit may further include a voltage controlled oscillator configured to generate a stable oscillating signal in response to each of an injection locking signal generated by the self injection locking component and a phase locked loop signal generated by the self phase locked loop component. The stable oscillating signal may be configured to RF modulate the oscillating optical signal. The voltage controlled oscillator may include reverse biased varactor diodes having an effective variable capacitance. The stable oscillating signal may be controlled at least in part by the effective variable capacitance of the reverse biased varactor diodes.

In some aspects of the disclosure, the opto-electronic oscillation circuit may further include a noise minimizing component electrically coupled to the self injection locking component and to the voltage controlled oscillator. The noise minimizing component may be configured to amplify the injection locking signal without adding substantial phase noise to the injection locking signal. The noise minimizing component may be one of a degenerative feedback amplifier, a reactively matched differential amplifier, and a trans-impedance differential amplifier. In some aspects, the circuit may further include a mode locking component coupled to the phase detector and to either one of a laser and a modulator from which the oscillating optical signal originates. The mode locking component may perform one of mode suppression, mode injection, mode coupling, mode combining, multi-mode injection coupling, and evanescent mode coupling techniques.

Some aspects of the disclosure provide that the fiber optic delay line of the self injection locking component may be a photonic bandgap based fiber exhibiting a reversed dispersion slope. In some aspects, fiber optic delay line of the self injection locking component may include a composite fiber including each of a single mode optical fiber and a photonic crystal fiber, each of which have opposing temperature slopes. The ratio between the lengths of the single mode optical fiber and the photonic crystal fiber amy be about 1:8.

Some aspects of the disclosure provide that the self injection locking component may further include a distributed Raman amplifier configured to inject pump optical power into the fiber optic delay line of the self injection locking component. The wavelength of the optical pump source may be shorter than the wavelength of the optical signal propagating over the fiber optic delay line. The resultant optical attenuation of the distributed fiber optic delay line may be reduced to about 0.05 dB/km or less.

In further aspects, the fiber optic delay line may have a predetermined attenuation factor and effective refraction index. The length of the fiber optic delay line may be selected to yield a quality factor that is greater than the maximum quality factor for a fiber optic delay line having a length less than 1 kilometer and the same attenuation factor and effective refraction index. The length of the fiber optic delay line may be optimally selected based on the equation: $Q=\pi f_{osc}\tau/a^l$. In some such aspects, the fiber optic delay line may receive pump optical power for distributed Raman amplification. The fiber optic delay line may also include a composite fiber including at least one single mode optical fiber or a solid core photonic bandgap fiber, and one hollow core photonic crystal fiber. The length of the fiber optic delay line may be selected to compromise between short term and long term stability of the RF modulated optical signal. In some aspects, the fiber optic delay line may be about 1 km long. In other aspects, the fiber optic delay line may be about 10 km long.

In yet further aspects of the disclosure, the self injection locking component may further include an optical filter configured to filter the optical signal propagating over the fiber optic delay line of the self injection locking component. The optical filter may include a Fabry-Perot etalon having a total loop length of about 10 meters. The beat frequency of the Fabry-Perot etalon may at least in part control the oscillating frequency of the RF modulated optical signal. The optical filter may include at least one optical transversal RF filter having an oscillation frequency derived using the formula: $\cos 2(2\pi f\Delta t)=1$. In some aspects, the optical filter may include a second optical transversal RF filter. The power of the optical signal may be split by a first coupler at an input side of the optical transversal RF filters and recombined by a second coupler at an output side of the filters. The first and second filters may have a difference in fiber delay length.

Each of the first coupler and the second coupler may be tunable variable couplers that are capable of adjusting the wavelength of the optical signal.

In some aspects, the optical power of the optical signal may be split among each of the transversal filters evenly. The difference in the fiber optic delay lengths may be selected based on the formula: $L_N-L_1=2^{N-2}\Delta L$. In other aspects, the optical power of the optical signal may be split among each of the transversal filters unevenly. The difference in the fiber optic delay lengths may be selected based on the formula: $L_N-L_1=(N-1)\Delta L$. In some of these aspects, the tranversal filter may include at least one polarization-sensitive optical fiber over which two optical signals are capable of propagating at different speeds. The polarization-sensitive optical fiber may have a length selected based on the following formula: $\Delta t=(n_1-n_2)l/c$.

In some aspects of the disclosure, the phase detector may include a comparator circuit configured to generate an analog voltage signal proportionate to a phase difference between two RF signals inputted to the phase detector. The analog voltage signal may fluctuate in response to changes in either the frequency or phase of the optical signal propagating over the self phase lock loop component. In some aspects, the fiber delay line of the self injection locking component may be the fiber delay line of the self phase locked loop component. In some aspects, the fiber delay line of the self injection locking component may be the fiber delay line of the self phase locked loop component. In other aspects, the self phase locked loop component may include at least three optical fibers, at least two of which are fiber optic delay lines, each of the fiber optic delay lines having a different delay length from one another. The self phase lock loop component may further include a multiple frequency discriminator. The multiple frequency discriminator may be configured to combine each of the optical signals propagating over the respective optical fibers.

In yet further aspects of the disclosure, the voltage controlled oscillator may include a tunable bandpass filter and a power amplifier. The power amplifier may be configured to amplify the injection locking input. In such aspects, the stable oscillating signal generated by the voltage controlled oscillator may be outputted by the voltage controlled oscillator with about 1 watt or greater power.

In even further aspects of the disclosure, the opto-electronic oscillation circuit may have a locking range of 20 MHz and a phase detuning of 5°. In some aspects, the opto-electronic oscillation circuit may have a natural resonance frequency of about 50 kHz or greater.

Another aspect of the disclosure provides an opto-electronic oscillator, including a modulator providing an optical signal, and a first optical filter for receiving a portion of the optical signal, and a second optical filter for receiving a portion of the optical signal. The first optical filter may have a output that is coupled to a first photodetector, and the second optical filter may have an output that is coupled to a second photodetector. The opto-electronic oscillator may further include a phase detector for receiving a first RF signal from the first photodetector and a second RF signal from the second photodetector. The second RF signal may have a longer delay than the first RF signal. The phase detector may be configured to determine a phase difference between the first and second RF signals. The opto-electronic oscillator may further include a voltage controlled oscillator for receiving one of the first RF signal from the first photodetector and the second RF signal from the second photodetector, and for receiving a third RF signal from the phase detector. The voltage controlled oscillator may be configured to output an oscillating signal in response to both the one of the first and second RF signals and the third RF signal. The oscillating signal may be used to control an output of the modulator. Specifically, the oscillating signal may be used to RF modulate the optical signal provided by the modulator. The oscillating signal may be used to control one of a frequency and a phase of an RF modulated optical signal produced by the optoelectronic oscillator.

In some aspects, the voltage controlled oscillator may include a tunable bandpass filter and a power amplifier. The tunable bandpass filter may be coupled to an input and an output of the power amplifier.

The optoelectronic oscillator may further include at least one composite optical fiber having a single mode fiber or a solid core photonic bandgap, and a hollow-core photonic crystal fiber. The optoelectronic oscillator may also include a distributed Raman amplifier, where the composite optical fiber may be capable of having an attenuation of about 0.05 dB/km or less. The opto-electronic oscillator may yet further include a wavelength tunable laser source for changing a delay of at least a portion of the optical signal, and for changing the passband center frequency of the optical filter. The optoelectronic oscillator may even further include a mode-locking component for stabilizing a plurality of modes of the optical signal provided by the modulator in phase with one another. Mode-locking may be achieved by adjusting operation condition of laser source and modulator In some aspects, the portion of the light signal received by one of the first optical filter and the second optical filter may be supplied through a fiber optic cable having a length that is at least about 1 kilometer. In other aspects, the portion of the light signal received by one of the first optical filter and the second optical filter is supplied through a fiber optic cable having a length that is at least about 10 kilometers.

BRIEF DESCRIPTION OF THE DRAWINGS

FIG. 3 is a tabular representation of data in accordance with an aspect of the disclosure.

DETAILED DESCRIPTION

The present invention achieves frequency and phase stability required for both a narrower channel resolution than that achieved by present systems (due to, e.g., reduction of phase noise) as well as a more precisely locked frequency (due to, e.g., reduced temperature sensitivity). As a result, more data (e.g., fidelity data) is, for example, able to be transmitted over a given bandwidth, all while reducing error rates for such transmitted data.

One object of the disclosure is to provide an oscillation system that allows for converting light energy into stable, spectrally pure RF/microwave reference signals having reduced close-to-carrier (offset frequency of 1 MHz or less) phase noise. Another object of the disclosure is to provide an oscillation system in which it is possible to maintain a precisely locked phase while still maintaining a clean close-in to carrier phase noise.

Yet another object of the disclosure is to provide an optoelectronic oscillation system having higher frequency selectivity in a relatively small size (compared to the larger size of a higher order electrically realized RF filter), reduced temperature sensitivity, minimized frequency drift, and/or enhanced dispersion-induced frequency synthesis characteristics.

Yet another object of the disclosure is to use a delay element (e.g., an optical fiber or electronic element) to store energy for a sufficient duration, for example, by using evanescent mode coupling and/or dynamic mode-spacing of the optical resonator, to achieve zero or minimum dispersion.

These and other objects of the disclosure are beneficial for obtaining an optoelectronic oscillator with a cleaner signal than the signals outputted by oscillators currently known in the art. For example, oscillators currently known in the art may achieve a noise reduction of, at best, about −110 to about −120 dBC/Hz at a 10 kHz offset. In contrast, the optoelectronic oscillator of the present disclosure may achieve a noise reduction of up to −150 dBC/Hz at a 10 kHz offset.

By achieving a cleaner signal, the optoelectronic oscillators of the present disclosure are capable of maintaining closely packed frequency channels and exhibit noise reduction, phase control, phase error reduction, and bit-error rate reduction sufficient enough to keep the closely packed frequency channels apart. Keeping frequency channels apart is especially important cellular technologies that rely on high-order frequency division, such as Orthogonal frequency-division multiplexing (OFDM) or high-order phase-shift keying (PSK). The optoelectronic oscillators of the present disclosure may also be utilized in base stations, radar systems, high resolution remote sensing systems, timekeeping systems, or frequency synthesizers.

Figure 1A:
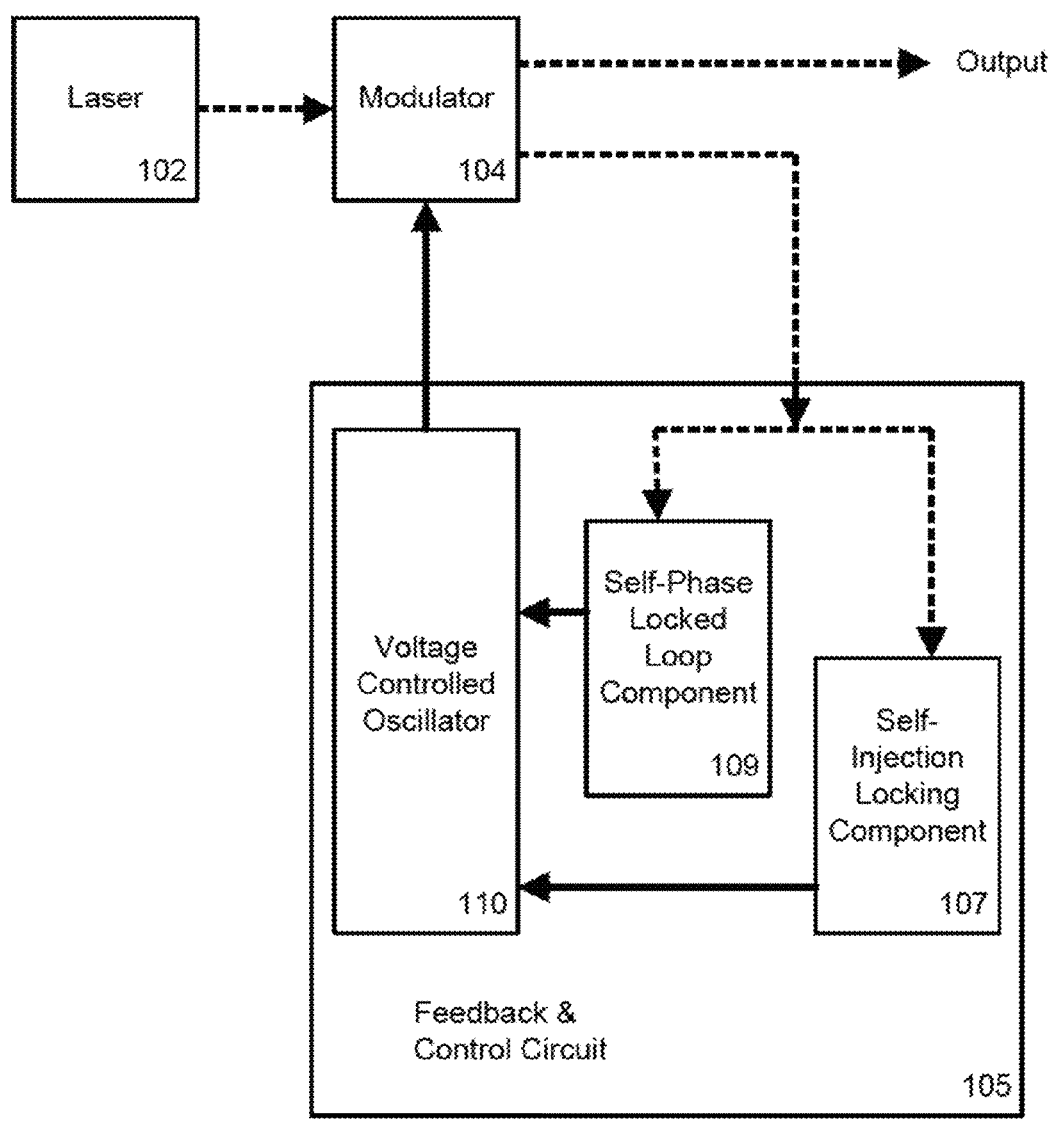
FIGS. 1a-1d are block diagrams depicting an optoelectronic oscillator in accordance with an aspect of the disclosure.

Referring now to the figures, FIG. 1a illustratively depicts a functional block diagram of an optoelectronic oscillator 100 in accordance with an aspect of the present invention. The oscillator 100 includes a laser 102, a modulator 104, and feedback and control circuitry 105. The laser 102 provides a light source (e.g., a high power light source) for operation of the oscillator 100. The intensity of the light source may be modulated by the modulator 104 to produce a time-varied optical signal, such as a sinusoidal optical waveform. The modulator 104 may be a Mach-Zehnder modulator or electro-absorption modulator, and may be capable of splitting the incoming signal into multiple signals. The modulator 104 may also be a phase modulator capable of modulating the phase of the split signals, and recombining the split signals to yield a signal having a shifted phase. For example, the modulator 104 may have a TE mode to provide for a 180 degree phase shift, or may recombine the incoming signal with a transverse electric ("TE") mode signal in order to yield a 180 degree phase shift of the signal. The modulator 104 may output the recombined signal as an outputted optical signal.

The outputted optical signal of the modulator 104 may be split into multiple output signals. In some aspects of the disclosure, the signal may be split by an optical directional coupler (not shown). The directional coupler may split the signal 50:50 and feed each signal into two distinct optical fiber cables. In some aspects of the disclosure, the optical signal may be split in order to provide an optical output for use external to the oscillator 100, as illustrated in FIG. 1a.

In the example of FIG. 1a, only an optical output node is illustrated. In other examples of the disclosure, the oscillator 100 may output either or both of a sustained RF modulated oscillating electrical output and a sustained RF modulated oscillating optical output. The sustained electrical output may be outputted at any point of the optoelectronic oscillator's electrical wiring, which is illustrated in FIG. 1a and the other figures of the disclosure by a solid line. The optical output may be outputted at any point of the optoelectronic oscillator's optical connection (except for the connection between the laser 102 and the modulator 104), which is illustrated in FIG. 1a and the other figures of the disclosure by a dashed line.

The optical signal outputted by the modulator 104 may be inputted into the feedback and control circuitry 105 of the oscillator 100. The feedback and control circuitry 105 may process the inputted optical signal. The processing may include conversion of the optical signal to an electrical signal. The electrical signal may then be fed back into the modulator 104 as an electrical input. The electrical input fed back into the modulator 104 may provide feedback for properly maintaining the stability of the signal outputted by the modulator 104 (e.g., prevent phase shift of the signal, prevent frequency shift of the signal, etc.).

The negative feedback circuit 105 may include each of a self-injection locking ("self IL") component 107 and a self-phase locked loop ("self PLL") component 109. As described in greater detail below, the self IL component 107 processes the inputted optical signal by transmitting the signal through a long delay line having a predetermined length, filtering the signal, and converting the signal to the electrical domain. The processed signal may then be used as would a signal from a master oscillator in an injection locking oscillator, feeding into a voltage controlled oscillator (VCO) 110 included in the feedback and control circuitry 105 and forcing the VCO 110 to oscillate, as a slave oscillator, in synchronicity with the processed signal. This feature may significantly reduce the far-away from carrier phase noise within the locking range of the injection locked VCO.

The self PLL component, also described in greater detail below, may process the inputted optical signal by splitting the optical signal into at least two optical signals, transmitting at least one of the split optical signals through a long delay line having a predetermined length, filtering the respective signals, and converting the respective signals to the electrical domain. The phase of each of the processed signals may then be compared using one or more phase comparators, such as a phase detector or a frequency discriminator, to produce a combined processed signal having reduced phase noise characteristics. The combined processed signal may be fed into the VCO 110 included in the feedback and control circuitry 105 to produce a control signal useful for controlling the VCO 110. This feature may significantly reduce the close-in to carrier phase noise within the locking range.

The VCO 110 may be any voltage controlled oscillator known in the art (e.g., a Clapp oscillator, Colpitts oscillator, etc.). In one example, the VCO 110 may include a varactor, such as an MOS varactor, Schottky diode, or a reverse biased PN junction diode varactor, which functions as a voltage-controlled capacitor. The effective capacitance of the varactor may vary with changes in the voltage of the processed signal received from the self PLL component 109. By adjusting or retuning the effective capacitance of the varactor in the VCO 110, the frequency at which the VCO 110 resonates may in turn be retuned.

Figure 1B:
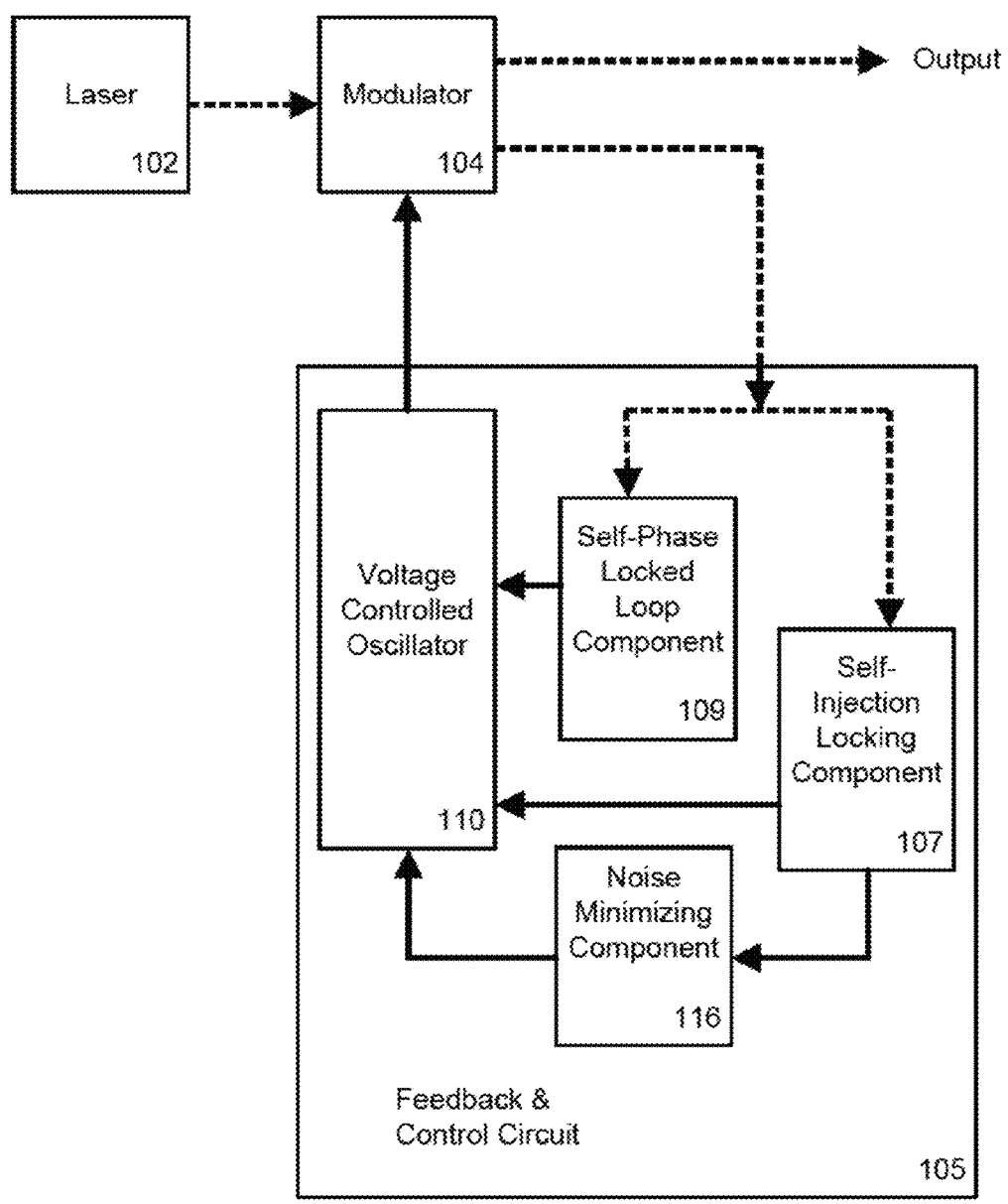

In some examples of the disclosure, as shown in FIG. 1b, the feedback and control circuitry 105 may further include a noise minimizing component 116 between the self injection locking component 107 and the VCO 110. In one example, the noise minimizing component 116 may include a low noise amplifier, such as a degenerative feedback amplifier using SiGe HBT devices. The low noise amplifier may be capable of boosting or amplifying the processed signal outputted by the self injection locking component 107 without adding substantial phase noise to the processed signal, such as phase noise caused by changes in amplitude (e.g., AM-PM conversion). Including the low noise amplifier may be beneficial for further increasing the locking range and reducing the phase noise of signal, or for maintaining a low amount of noise (e.g., amplitude noise) in the signal (e.g., due to high AM compression of the self-IL component).

Figure 1C:
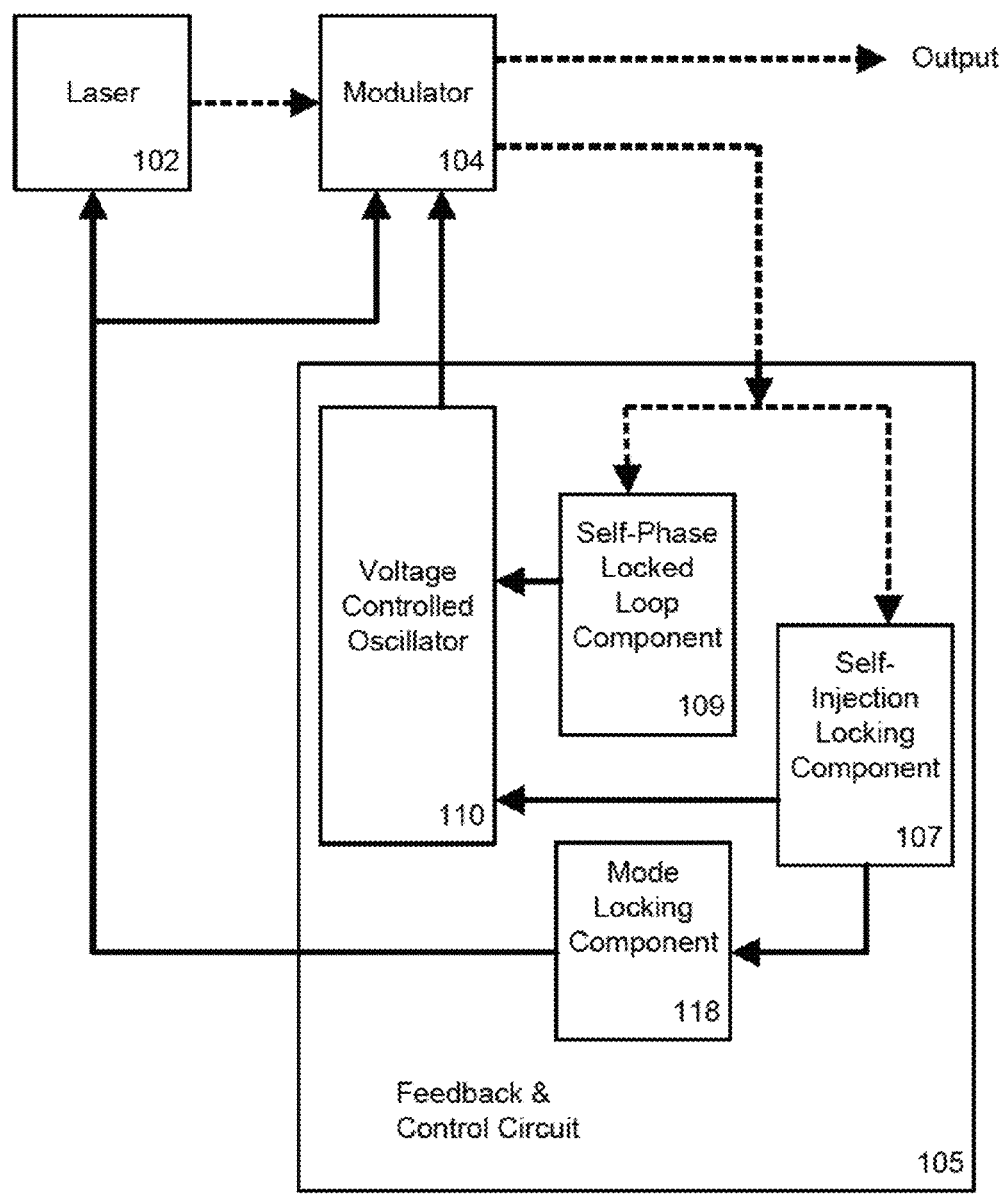
Figure 1D:
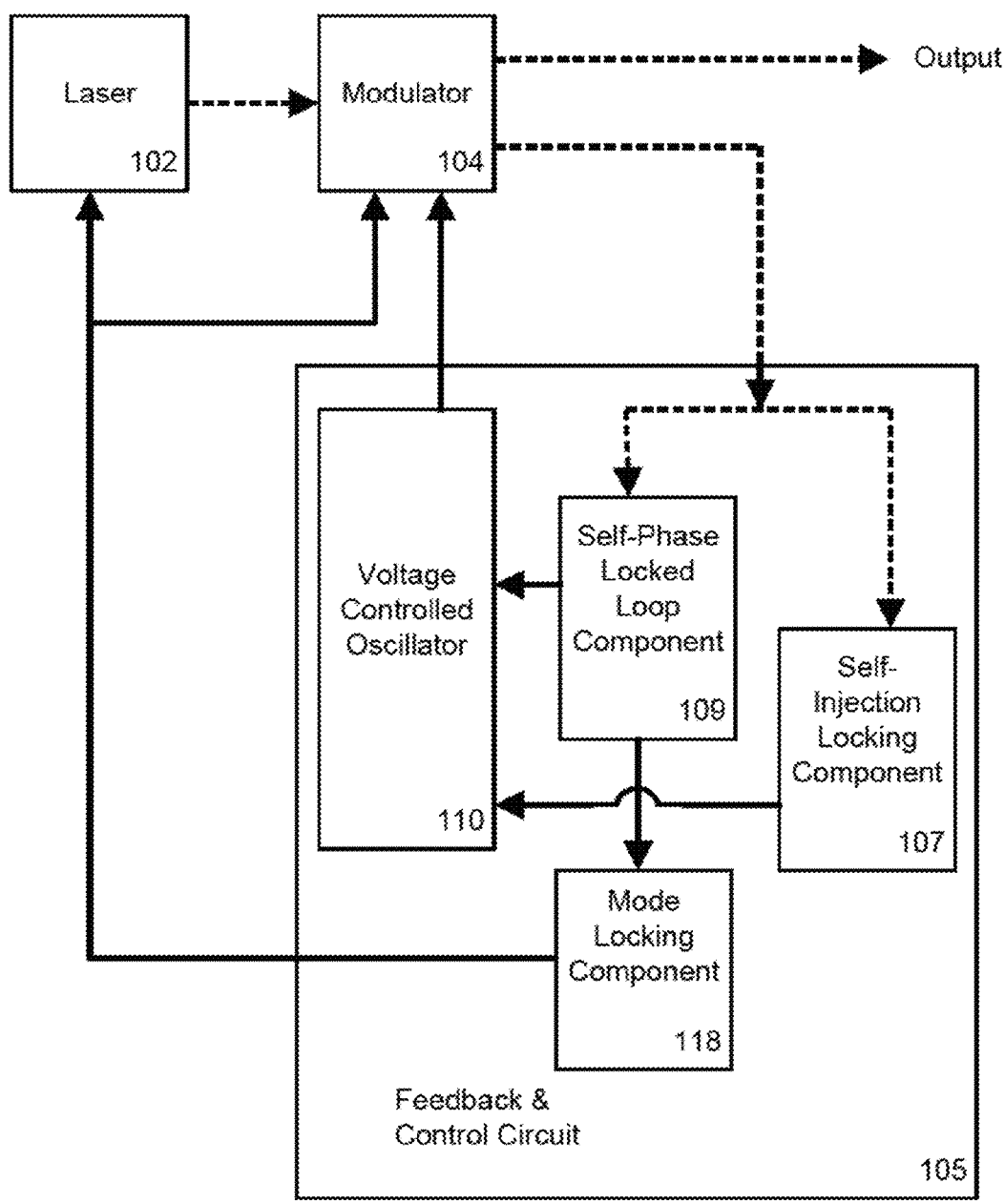

In some examples of the disclosure, as shown in FIGS. 1c and 1d, the feedback and control circuitry 105 may further include a mode locking component 118 to regulate the effective length of the optical delay lines included in the feedback and control circuitry 105. For example, the optical delay lines may be intrinsically temperature sensitive, and even slight temperature fluctuations may cause mode-jumping phenomena, thereby degrading the close-in to carrier phase noise of the OEO. Mode locking reduces these fluctuations may introducing an electrical signal (e.g., output signal of a phase detector) into the cavity of the laser and/or modulator, which creates a small Doppler shift for the light passing through the cavity. Assuming that the modulation frequency matches the round trip time of the cavity (e.g., an integer multiple of the mode spacing), the multiple modes of the laser and/or modulator should constructively interfere with one another to produce stable and high-quality short pulses. In some examples of the disclosure, the mode locking component may be fed from the self injection locking component 107 to either or both of the laser 102 and the modulator 104. In other examples, the mode locking component may be fed from the self phase locked loop component 109 to either or both of laser 102 and the modulator 104. In any of these example configurations, the mode locking component 118 may be beneficial for changing operation conditions (e.g., locking optical modes) of the laser 102 and/or modulator 104 output to a fixed phase. Further, the mode locking component 109 may utilize any of mode suppression, mode injection, mode coupling, mode combining, multi-mode injection coupling, or evanescent mode coupling techniques in order to achieve locking of the signal's mode location, including a large number of supported modes, such that it has a uniformly fixed mode spacing, zero or minimum frequency drift of the locked signal, and significantly reduced close-in to carrier phase noise.

Although the self injection locking component 107 and self phase locked loop component 109 are depicted in each of FIGS. 1a-1d as separate components, the components may share some optical and/or electrical circuitry, as described below in greater detail in connection with FIG. 2.

Figure 2:
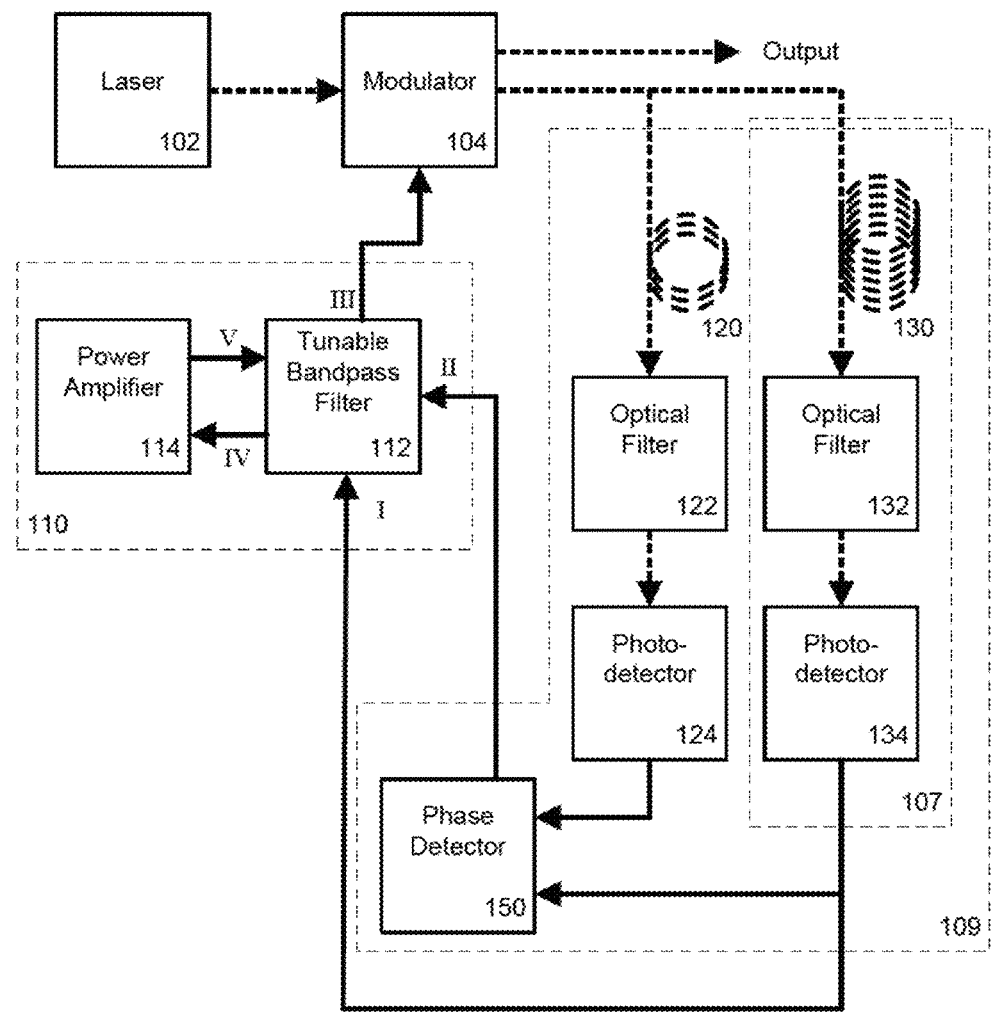
FIG. 2 is another block diagram depicting an optoelectronic oscillator in accordance with an aspect of the disclosure.

FIG. 2 illustratively depicts the feedback and control circuitry 105 of the optoelectronic oscillator 100 of FIG. 1a in accordance with a further aspect of the present disclosure. Specifically, the respective circuitry included in each of the self IL component 107 and the self PLL component 109 is shown in greater detail. Furthermore, the VCO 110 of FIG. 1a is depicted in greater detail to show the respective components (e.g., input and output ports) of the VCO 110.

Turning first to the circuitry of the self IL component 107, the self IL component may include a fiber optic delay line 130, an optical filter 132, and a photodetector 134.

The fiber optic delay line 130 may include a photonic bandgap ("PBG") based fiber. In PBG fiber, light is guided through the use of photonic bandgaps in a hollow core fiber, such as a seven-cell hollow core fiber. As such, certain frequency ranges of light are prohibited from propagating, while other frequencies are permitted to propagate. Additionally, due to the type of waveguiding mechanism utilized by PBG fiber, PBG fiber exhibits a reversed dispersion slope, resulting in anomalous dispersion of the propagating optical signal.

The fiber optic delay line 130 may be capable of propagating an optical signal outputted by the modulator 104 along a long distance without substantially attenuating the signal. The fiber optic delay line 130 may include certain components or be selected to have certain characteristics that prevent and/or reduce attenuation of the propagating optical signal.

In one aspect, the fiber optic delay line 130 may include a distributed Raman amplifier. A Raman pump laser of the distributed Raman amplifier may inject energy (e.g., pump current for powering a Raman pump laser source) at a predetermined wavelength into the fiber optic delay line. The wavelength of the injected energy may be slightly shorter than the wavelength of the optical signal propagating through the fiber optic delay line 130. As the pump energy injected into the fiber optic delay line 130 undergoes nonlinear stimulated Raman scattering, the probe wavelength will increase due to Stokes shifting. As a result, the wavelength of the pump energy may be selected to transfer energy to the wavelength of the propagated optical signal. Both co-propagating and counter-propagating pump beams may be used. Accordingly, the energy level of the propagated optical signal may be increased relative to the amount of energy injected into the cable by the pump laser without significant added optical noise.

The wavelength or frequency of the pump is selected so that as a result of the Raman effect or scattering, energy is transferred from the pump laser's wavelength to the wavelength of the optical signal. This typically occurs as a result of nonlinear absorption-relaxation phenomena in which lights at the pump wavelength, after such nonlinear phenomena, are emitted at the wavelength of the propagated optical signal. Thus, the wavelength of the pump laser is selected based on the wavelength of the propagating optical signal or vice versa. In some examples of the disclosure, the wavelength of the injected pump laser signal may be selected such that the distributed optical attenuation of the fiber optic delay line 130 may be reduced to about 0.05 dB/km or less.

FIG. 3 presents a tabular depiction of the enhancement to the Q factor that is yielded by distributed Raman amplification of a 4 km long fiber delay line. As shown in the analytical data presented in FIG. 3, utilization of Raman amplification may reduce attenuation of the fiber optic delay line 130 having a length of about 4 km to 0.05 dB/km, which in turn may result in a phase noise reduction of about −148 dBc/Hz for an oscillator having an offset of 10 kHz coupled to the delay line. As such, the Q factor enhancement of such an oscillator may be about 4 dB. As described below, close-in to carrier phase noise may be further reduced, for example by selecting an appropriate length for the given distributed fiber delay line attenuation.

In other aspect, the fiber optic delay line may include a composite fiber. The composite fiber may include each of a single mode optical fiber (SMF) (e.g., Corning® SMF-fiber) or solid core photonic bandgap (SC-PBG) having a positive temperature slope and a hollow core photonic crystal fiber (HC-PCF) having a negative temperature slope. Generally, fluctuations in temperature can affect the long term temperature stability of the OEO. By combining two cables having opposing dispersion characteristics into a composite fiber, such that temperature fluctuations are somewhat passively compensated.

In combining SMF/SC-PBG and HC-PCF to yield passively temperature compensating fibers, it is important to choose an appropriate ratio between the lengths of each of the fibers. In some aspects of the disclosure, the appropriate length ratio is about 8:1, that is the HC-PCF fiber being eight times longer than the SMF fiber.

In yet another aspect, the fiber optic delay line 130 may be selected to have a length yielding an optimized, or relatively optimized, quality factor (Q factor). The Q factor of a resonator can be expressed in terms of the ratio between the energy stored and the power dissipated by the resonator. This ratio may be calculated according to the following equation:

$$Q = \frac{\text{Total Phase Stored}}{\text{Total Loss}} = \frac{\pi f_{osc} \tau}{a^l}$$

where $f_{osc}$ is the oscillation frequency of the optical signal, $\tau = nl/c$ (where $\tau$ is the loop delay time; n is the effective refraction index of the fiber; l is the length of the fiber optic delay line 130; and c is the speed of the light;) and $a = 10^{(\alpha/10)}$ (where $\alpha$ is the attenuation factor of the fiber optic delay line 130). As is evident from the above equation, the length of the fiber optic delay line 130 factors into both the energy stored by the resonator and the power dissipated by the resonator. Because the length is linearly proportionate to the energy stored and exponentially proportionate to the power dissipated, there is an optimum length (l) for which the Q factor is maximized.

Figure 4:
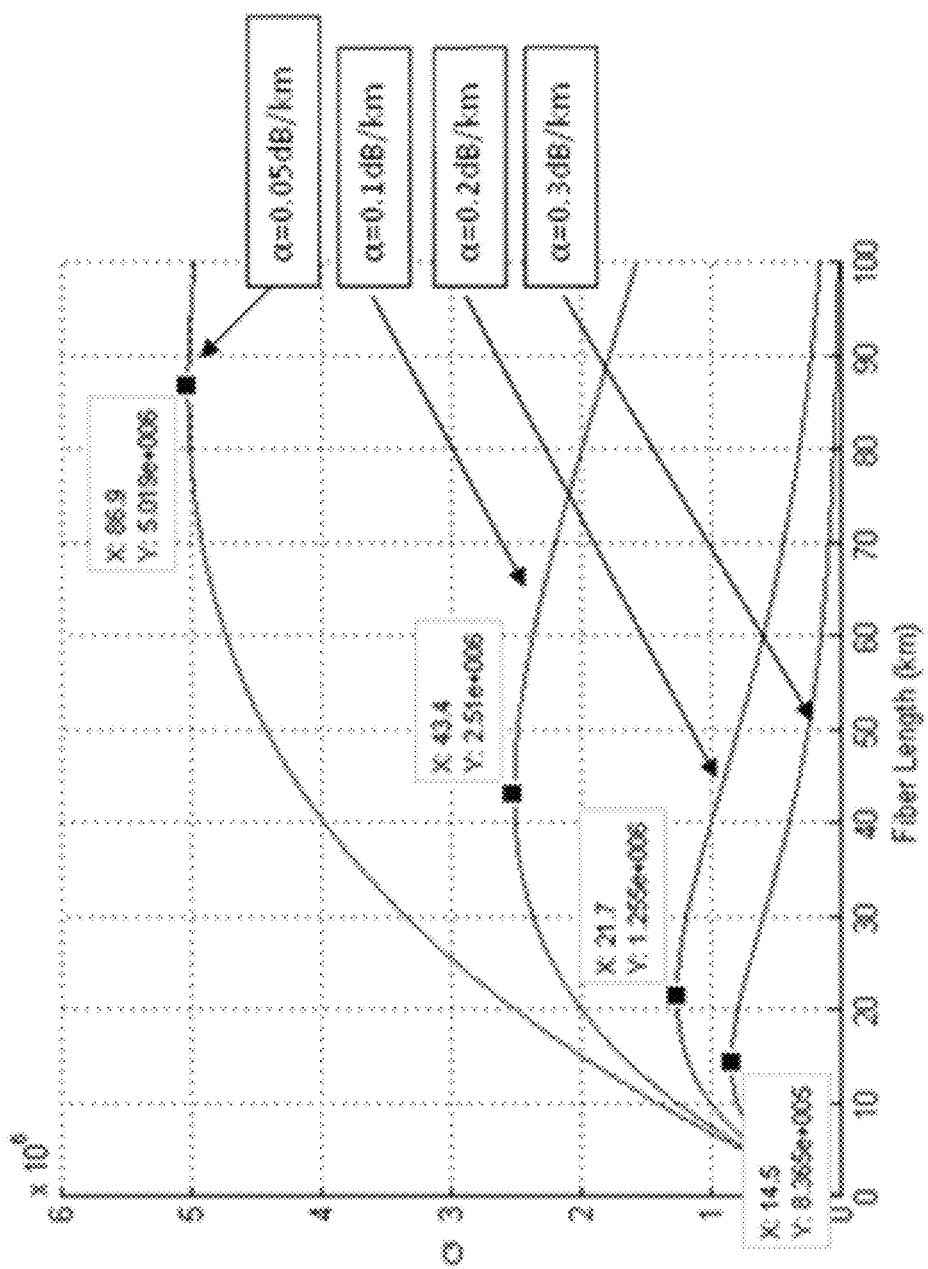
FIG. 4 is a graphical representation of data in accordance with an aspect of the disclosure.

FIG. 4 depicts a graphical plotting of Q against a range of fiber optic cable lengths (l) in a 10 GHz oscillator for each of several possible attenuation factors of optical fiber based delay lines. For illustrative purposes, it is noted that a fiber optic cable having an attenuation factor of about 0.2 dB/km achieves a maximum Q factor (i.e., energy storage to power dissipation ratio) when the cable has a length of about 21.7 km. Accordingly, the optimum length of a fiber optic cable having an attenuation factor of about 0.2 dB/km is about 21.7 km. In such an example, a fiber optic cable having a Q factor of about 1.2E6 is obtained.

Figure 5:
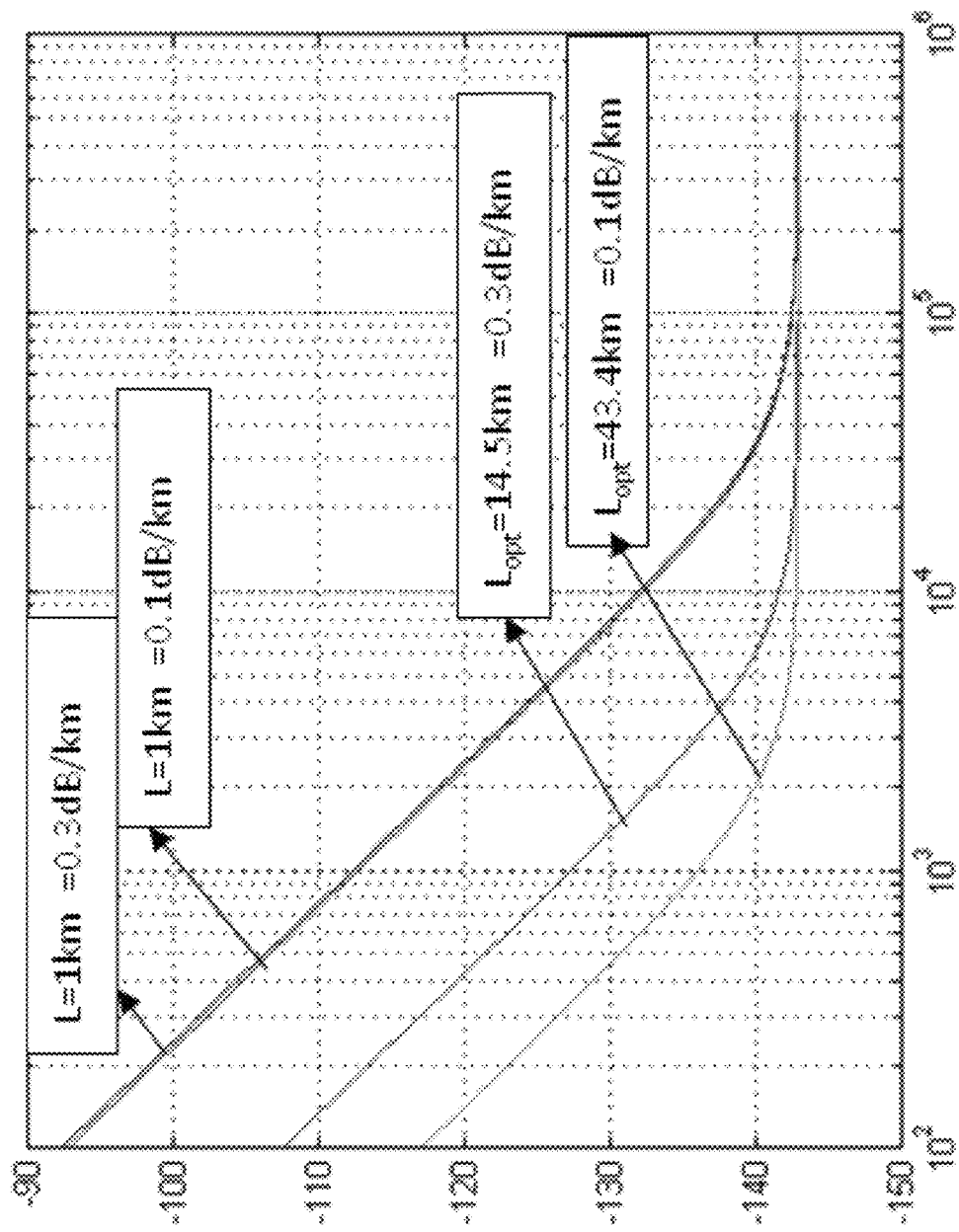
FIG. 5 is another graphical representation of data in accordance with an aspect of the disclosure.

For further illustration, FIG. 5 depicts a graphical plot of close-in to carrier phase noise in the 10 GHz oscillator of FIG. 4 for optical fiber cables having attenuation factors of 0.1 dB/km and 0.3 dB/km. In the example of FIG. 5, a substantially reduced close-in carrier phase noise is achieved when an optimum length of cable (e.g., 14.5 km for the 0.3 dB/km fiber, 43.4 km for the 0.1 dB/km fiber), as compared to using a 1 km length of cable, is used.

Each of the Raman amplifier, the optimum delay length, and the composite fiber provide valuable improvements to the fiber optic delay line. However, in some examples, the valuable aspects of one feature may be countereffective towards the valuable aspects of another feature. For example, use of a composite SMF/HC-PCF optical cable may reduce the overall Q factor of the cable, as compared to the quality factor of an entirely SMF cable (e.g., when losses in HC-PCF are substantial). The degradation in Q factor due to the composite SMF/HC-PCF optical cable may be measured using the following formula:

$$Q_{total} = \frac{1}{2} \times \frac{\beta_s l_s + \beta_p l_p}{\alpha_s l_s + \alpha_p l_p}$$

For example, using the above formula, the Q factor may be calculated for a composite fiber in which the SMF and HC-PCF fibers are chosen such that the ratio of the phase constants is $\beta_{PCF}=0.5\beta_{SMF}$, the ratio of the attenuation constants is $\alpha_{PCF}=30\alpha_{SMF}$, $\alpha_{PCF}=10$ dB/km, and $\alpha_{SMF}=0.33$ dB/km. Based on the above data, the total quality factor ($Q_{total}$) of the composite fiber will be about $(Q_s)/48$ where $Q_s$ is the quality factor of the standard SMF cable (i.e., not combined with the HC-PCF cable). For further example, combining a 30 meter long HC-PCF cable having attenuation $\alpha_{PCF}=2$ dB/m with a 1 km long SMF-28 cable having attenuation $\alpha_{SMF}=0.33$ dB/km, may yield an increase in phase noise of about 45 dB between 1 kHz and 10 kHz.

Despite the increase in phase noise yielded by the composite fiber, it is nonetheless beneficial to balance the temperature compensation advantages of such fiber with its disadvantages. Thus, the optimum length and Raman amplifiers of the fiber optic delay line 130 should be selected with all of these advantages and disadvantages in mind. For example, the optimum length of each of the SMF and HC-PCF cables may be selected so as to compromise between short term stability (as manifested by close-in to carrier phase noise (dBC/Hz)) and long term stability (as represented by frequency drift due to temperature (ppm/C)) of the composite delay line. Further, distributed Raman amplification may be employed to reduce losses in HC-PCF or SC-PBG fibers. In one such example of the disclosure with optical loss in the range of about 0.05 dB/km or less, the optimum length of the composite fiber may be in the range of about 86.9 km, and may exhibit about 20 dB reduction in close-in to carrier phase noise, as compared to results of a 4 km long fiber optic delay line. In another such example, a composite fiber having a length of 1 km and a length ratio of 1:8 (as described above) may experience a phase noise reduction of about 14 dB between 1 kHz to 10 kHz, as optical loss is reduced.

In some examples, the selected length for the fiber optic delay line 130 may be about 1 kilometer or longer. In some examples, the selected length for the fiber optic delay line 130 may be about 10 kilometers or longer.

The optical filter 132 may receive and filter optical signals that propagate through the optical fiber delay line 130. Optoelectronic oscillators known in the art commonly filter the oscillating signal using a standard RF filter after the oscillating signal has been converted to the electrical domain. In contrast, the oscillator of FIG. 2 is capable of filtering the oscillating signal in the optical domain prior to conversion of the signal to the electrical domain.

Optical filtering yields several benefits over using an electrical RF filter. For example, when an optoelectronic oscillator includes a fiber optic delay line (such as delay line 130), it becomes increasingly necessary to filter such a signal using an ultra narrow bandwidth RF filter. However, producing such a filter can be very costly in terms of weight, size, and manufacturing cost. Additionally, RF filters exhibit greater temperature dependency, such that small fluctuations in temperature may result in significant fluctuations in the resonance frequency. As such, the phase induced by the RF filter is subject to change, depending on the temperature. Such phase changes may in turn affect the total round trip time of the microwave signal, ultimately changing the oscillation frequency.

In contrast, the optical filter 132 of the present disclosure is less costly than the alternative ultra narrow bandwidth RF filter. Additionally, the optical filter 132 may exhibit less temperature sensitivity, and thus fewer phase and oscillation frequency fluctuations, while providing a very high frequency selectivity due to a large Q factor. The optical filter 132 may further provide a wider tuning range as the wavelength of an optical source of the oscillating signal is adjusted.

In some aspects, the optical filter 132 may include a high finesse Fabry-Perot etalon as a frequency selector. In some examples of the disclosure, the etalon may have a free spectral range ("FSR") of about 10.28 GHz, a finesse of about 1000, and a total loop length of about 10 meters. The beat frequency of the etalon may become the final oscillating frequency of the optical filter 132.

Figure 6:
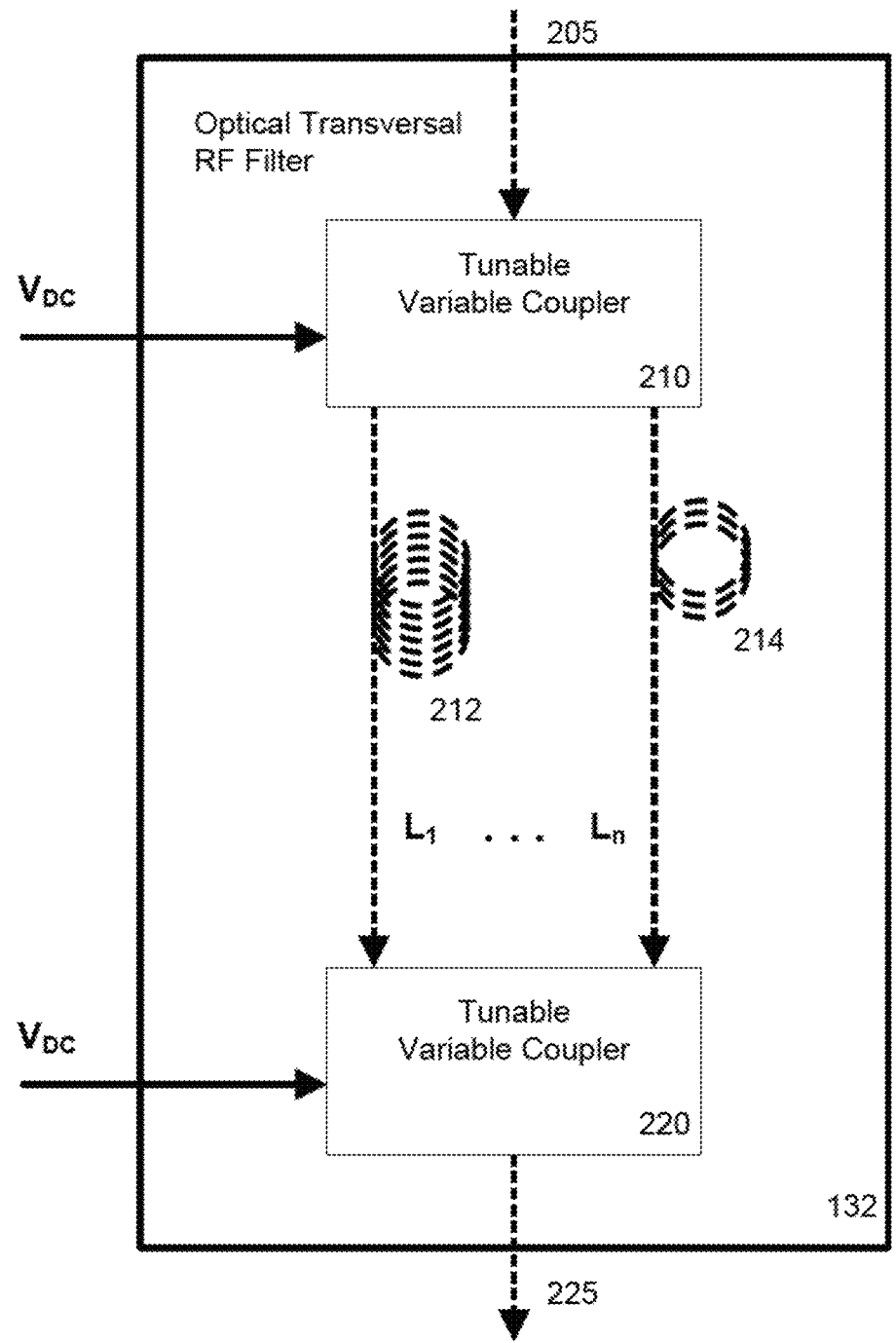
FIG. 6 is a block diagram depicting an optical filter in accordance with an aspect of the disclosure.

In some aspects, the optical filter 132 may include an optical transversal RF filter as shown in FIG. 6. The optical transversal RF filter is particularly beneficial because it is capable of providing a high quality factor for long differential delays along with a wide tuning range using dispersive optical fibers. In such an example, the oscillation frequency of the transversal filter may be derived according to the following equation:

$$f_n = \frac{n}{\Delta\lambda \cdot \chi}$$

where n is the order of the resonance frequency, $\Delta\lambda$ is the optical channel spacing, and $\chi$ is the dispersion of an optical fiber (e.g., having a length of about 1 km or greater). For purposes of illustration, when $\Delta\lambda=0.4$ nm and $\chi=609$(ps)/(nm), the oscillation frequency of the transversal filter is 4.1 GHz. For further illustration, when $\Delta\lambda=0.4$ nm and $\chi=339$ (ps)/(nm), the oscillation frequency is 7.3 GHz. When $\Delta\lambda=0.3$ nm and $\chi=339$(ps)/(nm), the oscillation frequency is 9.7 GHz.

In some examples, multiple optical transversal RF filters, like the one described above, may be cascaded (i.e., placed in series or parallel). Cascading the multiple optical transversal RF filters would effectively make a purely optical nested loop narrow band RF filter.

The example of FIG. 6 depicts a detailed block diagram of an optical transversal RF filter. In the example of FIG. 6, an input port 205 may receives an optical signal. The optical signal is relayed to a first tunable coupler 210 having a variable coupling ratio. The optical power carried by the signal is split by the tunable coupler 210 between a first delay line 212 and other delay lines, such as delay line 214. In some examples, the tunable coupler 210 may split the energy evenly (e.g., about 50:50 in an example having two delay lines, about 25:25:25:25 in an example having four delay lines, etc.). In other examples, the tunable coupler 210 may split the energy unevenly (e.g., 25:75 in an example having two delay lines, etc.). The split optical signal is relayed to a second variable coupler 220 over a pair of fiber optic delay lines 212 and 214 having uneven delay lengths. The split optical signal is then recombined by a second tunable coupler 220 having a variable coupling ratio. The recombined optical signal is outputted from the filter 132 at output port 225.

Each of the tunable couplers 210 and 220 may be tuned by a direct current input $V_{DC}$. Tuning the couplers 210 and 220 may change the passband center frequency of the optical filter, which in turn may delay the optical signal passing through the optical filter 132.

Focusing on fiber optic delay lines 212 and 214, the difference in length between each of these delay lines may be chosen or properly synthesized such that narrowband RF filtering is achieved and insertion loss of the relayed RF signal is minimized.

Figure 7A:
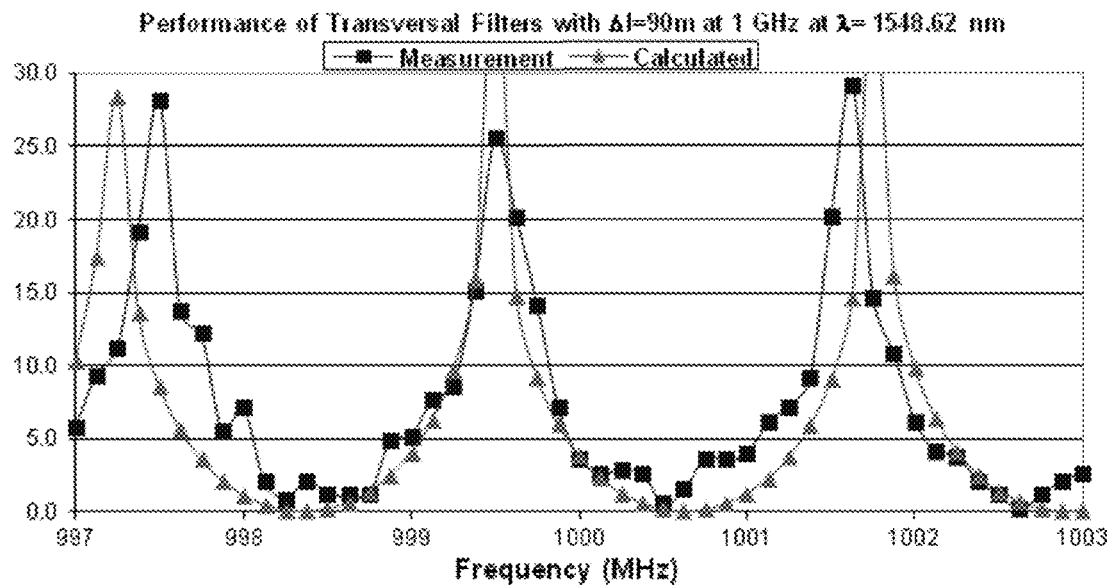
FIGS. 7a-7b are graphical representations of data in accordance with an aspect of the disclosure.
Figure 7B:
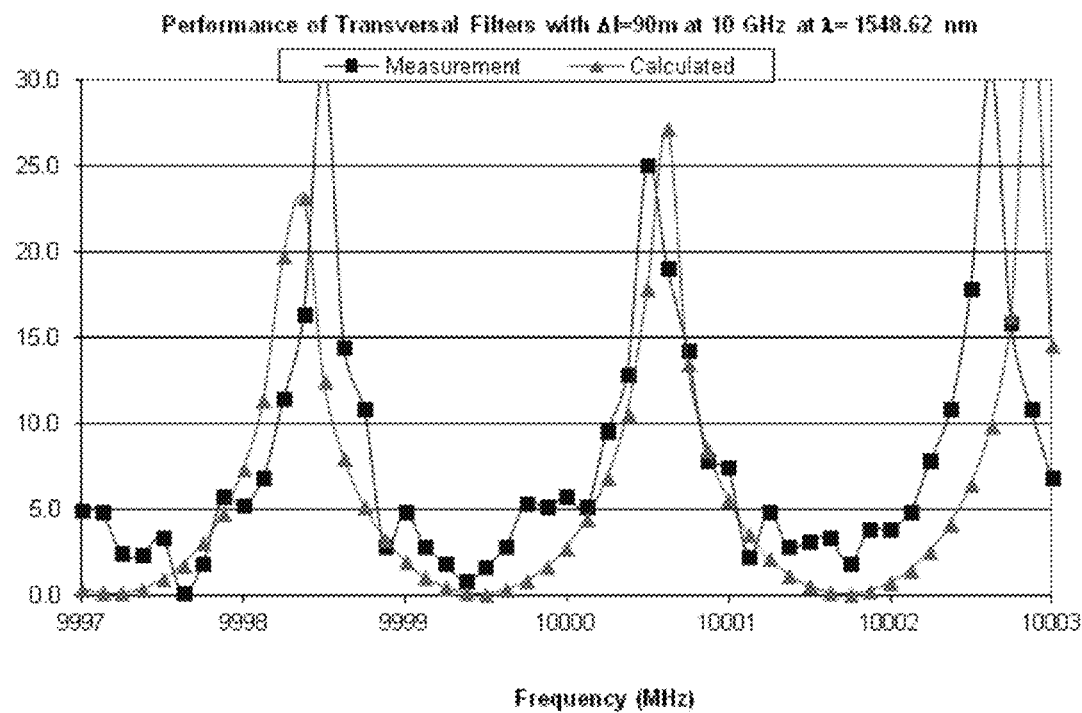

FIGS. 7a and 7b graphically depict experimental results indicating the expected performance of an optical transversal RF filter, like the filter of FIG. 6. In the examples of FIGS. 7a and 7b, an optical transversal RF filter includes two optical fiber delay lines with a difference of about 90 meters in length, and receives an optical signal from a source with an optical wavelength of about 1548.62 nm. The transversal filter of FIG. 7a is included in an oscillator operating at around a frequency of about 1000 MHz. The transversal filter of FIG. 7b is included in an oscillator operating at around a frequency of about 10,000 MHz.

The optical transversal RF filter of FIG. 5 may be further improved by replacing it with a higher order filter. For example, the optical transversal RF filter 132 may be of order N−1, having N optical fiber delay lines.

Figure 8A:
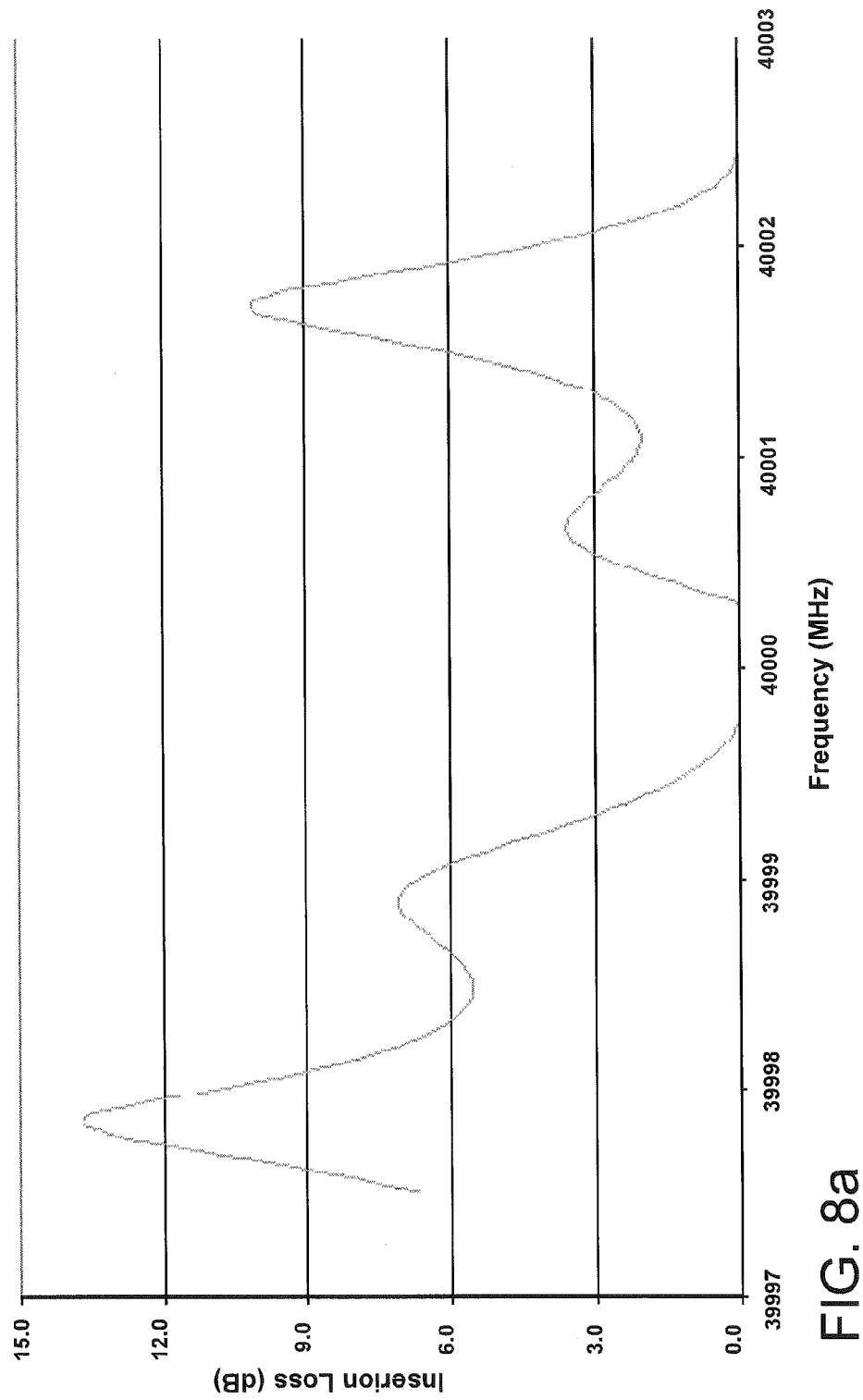
FIGS. 8a-8c are graphical representations of data in accordance with an aspect of the disclosure.

Some examples of N−1 order transversal filters are designed for unequal splitting of the optical signal energy. In some examples, the difference in length between each of the N optical fiber delay lines may be chosen such that $L_2-L_1=\Delta L$, $L_N-L_1=2^{N-2}\Delta L$, etc. For example, the delay lengths of each of four delay lines may be 0, 38, 78, and 152 meters, respectively. A simulation of the insertion loss of such a filter is depicted in FIG. 8a for a combination of these delay lines at 1550 nm operating as a filter at about 40,000 MHz.

Figure 8B:
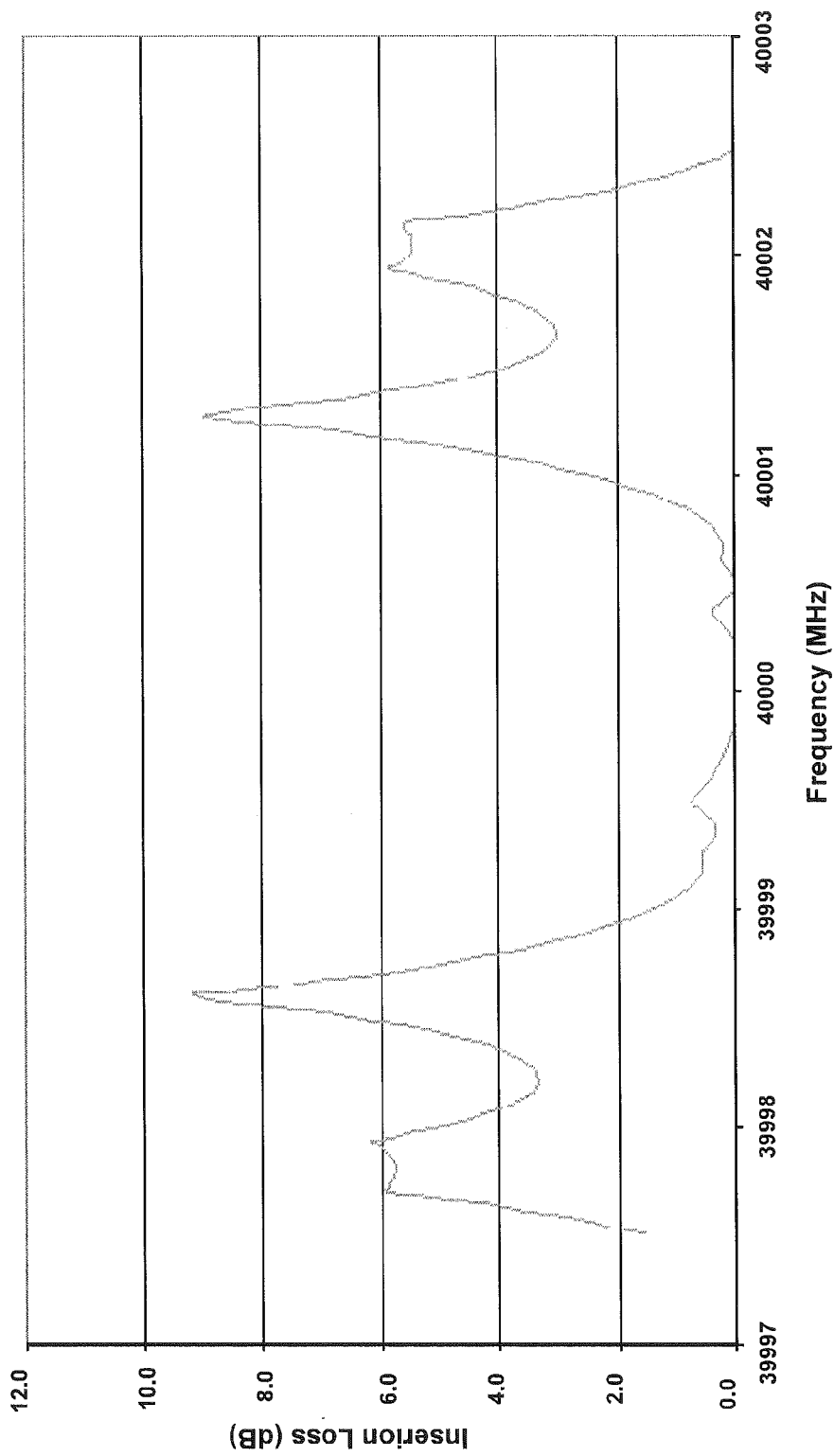

Other examples of N−1 order transversal filters are designed for equal splitting of the optical signal energy. In such examples, the difference in length between each of the N optical fiber delay lines 231-234 may be chosen such that $L_2-L_1=\Delta L$, $L_N-L_1=(N-1)\Delta L$, etc. For example, the delay lengths of each of lines 231-234 may be 0, 75, 150, and 225 meters, respectively. A simulation of the insertion loss of such a filter is depicted in FIG. 8b for a combination of these delay lines at 1550 nm operating as a filter at about 40,000 MHz.

Figure 8C:
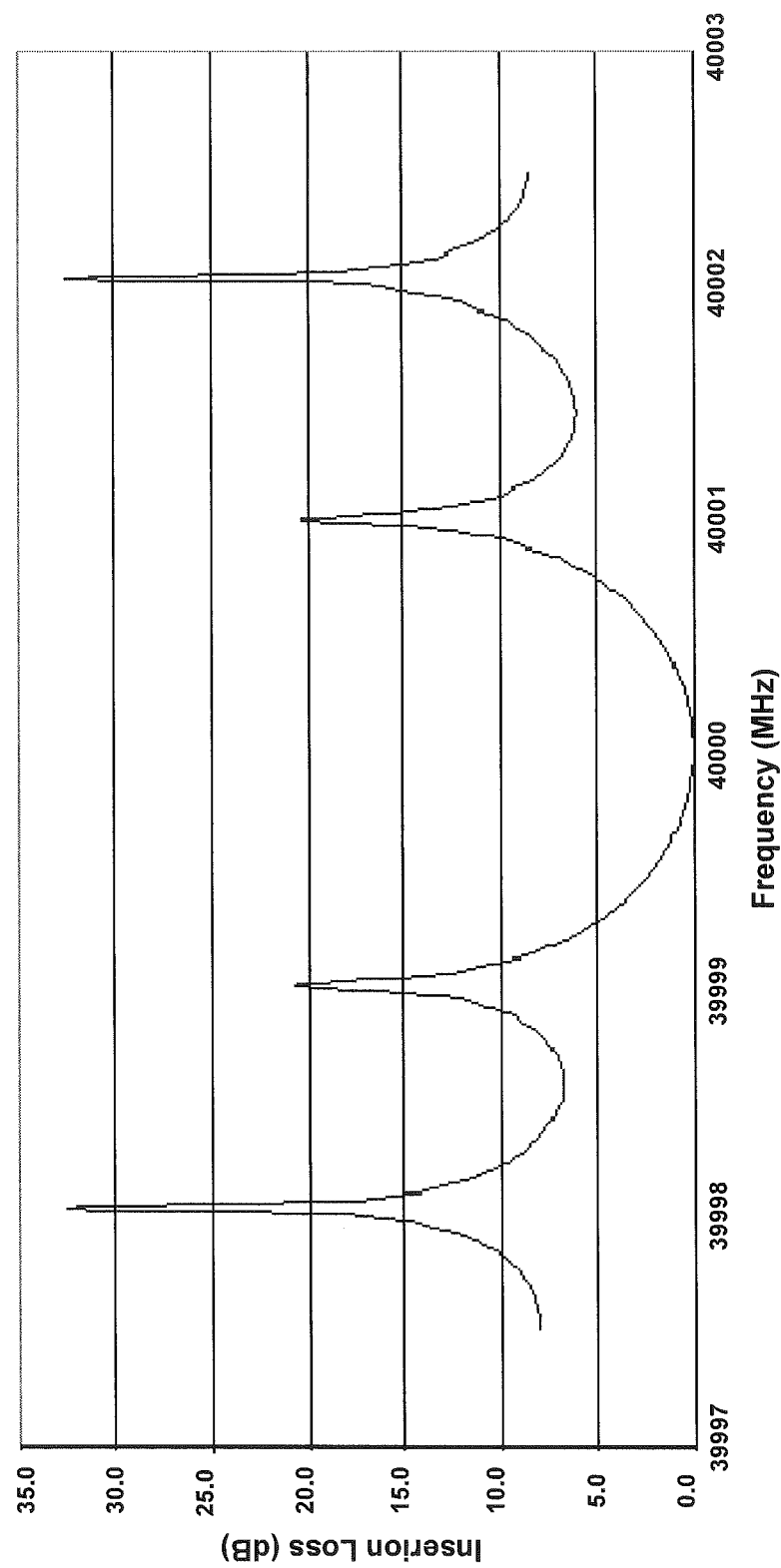

Although the diagram of FIG. 6 depicts a cascaded transversal filter having multiple delay lines in parallel, it will be understood that similar results may be achieved with serial cascading of delay lines as well. For example, three first order transversal filters may be arranged in series, each first order transversal filter having differential fiber optic length $\Delta L$, and the differential fiber optic length of each transversal filter differing from the differential fiber optic length of the next transversal filter based on the formulas provided above. A simulation of the insertion loss of such a series of filters is depicted in FIG. 8c.

In some examples, the transversal filter 132 may include one or more polarization-sensitive optical fibers. Light that travels through a polarization-sensitive optical fiber experiences a different index of refraction depending on the orientation of the propagating wave. As such, two optical signals with perpendicular orientations will propagate across the polarization-sensitive optical fiber at differing speeds, effectively turning the polarization-sensitive optical fiber into two parallel delay lines having differing lengths. The effective difference in delay line lengths for the polarization-sensitive optical fiber delay may be calculated using the following formula:

$$\Delta t = \frac{(n_1 - n_2) \cdot l}{c}$$

where, $n_1$ is the index of refraction along a first axis of the polarization-sensitive optical fiber, $n_2$ is the index of refraction along a second axis perpendicular to the first axis of the optical fiber, l is the length of the optical fiber, and c is the speed of light in vacuum.

Using the value of $\Delta t$ derived from the above equation, the oscillation frequency of the transversal filter may be calculated based on the following formula:

$$\cos^2(2\pi f \cdot \Delta t) = 1$$

The photodetector 134 may provide for conversion of the optical signal into an electrical signal. In some examples of the disclosure, the photodetector 134 may be a 1550 nanometer high-speed, high-power handling photodetector (e.g., pin photodiode). The output of photodetector 134 may be coupled to a low noise amplifier (not shown) in order to increase the power of the injection signal. Use of a low noise amplifier and other low noise electrical components is beneficial for ensuring that the self-injection signal is maintained over its own and foreign signal noise. Other low noise electrical components included in the feedback and control circuitry 105 may include degenerative feedback amplifier using SiGe HBT devices, trans-impedance and reactively matched amplifiers, and other circuitry for differential optical detection and/or differential amplification (e.g., for common mode rejection of amplified relative intensity noise and spontaneous noise generated by the optical Raman amplifier.

Turning next to the circuitry of the self PLL component 109, the self PLL component 109 may include one or more fiber optic delay lines 120 and 130. Each delay line 120/130 may be connected to an optical filter 122/132 and to a photodetector 124/134. The delay lines, optical filters and photodetector implemented in the self-PLL component 109 may be identical or similar to, or include identical or similar properties as those implemented in the self-IL component 107. The self-PLL component 109 may also include a phase detector 150.

As a general overview, the self-PLL component 109 works by recombining an optical signal with a phase delayed version of itself at the phase detector 150. The phase detector 150 may be a comparator circuit (e.g., a frequency mixer) configured to generate an analog voltage signal proportionate to a phase difference between two or more input signals. In the case of self-PLL, each of the signals fed into the phase detector 150 originates from the modulator 104. As such, the modulator 104 in some examples may utilize a dual frequency laser ("DFL") with at least two output frequencies. In such examples, the phase locking range may be increased and sidemodes of the received signals may be eliminated, thereby stabilizing the microwave output of the oscillator.

The recombined signal may fluctuate based on slight fluctuations in the frequency and phase of the optical signal. Thus, the self-PLL component 109 provides a way to recognize slight fluctuations in the optical signal outputted by the modulator 104. Correcting these slight fluctuations in turn results in greatly improved phase stability of the oscillator signal.

In constructing a self-PLL oscillator, it is important to consider the overall phase noise of the oscillator circuit. That phase noise may be analyzed using the following formula:

$$S_\phi(f') = \frac{S_{\phi 0}(f')}{(2\pi\tau f')^2}$$

in which $S_{\phi 0}(f')$ is the phase noise of the free running VCO to which the self-PLL component is connected; reference signal; f' is the offset frequency; and r is the feedback delay time of the fiber optic delay line 120/130. Based on the above formula, the longer the feedback delay time of the self-PLL component 109, the lower the phase noise of the oscillator circuit.

As such, it is desirable to increase the fiber optic delay line of the self-PLL component 109, much like in the self-IL component. Accordingly, in some examples, the self-PLL and self-IL components may share a fiber optic delay line. This may be accomplished by splitting the fiber optic delay line to allow the oscillating signal to be both fed into a phase detector 150 of the self-PLL component 109 as well as used as the master locking signal of the self-IL component 107. In some examples, the signal may be split after passing through an optical fiber delay but before reaching the phase detector 150. The signal may be split in either the optical domain (e.g., before passing through the photodetector) or in the electrical domain (e.g., after passing through the photodetector).

Figure 9:
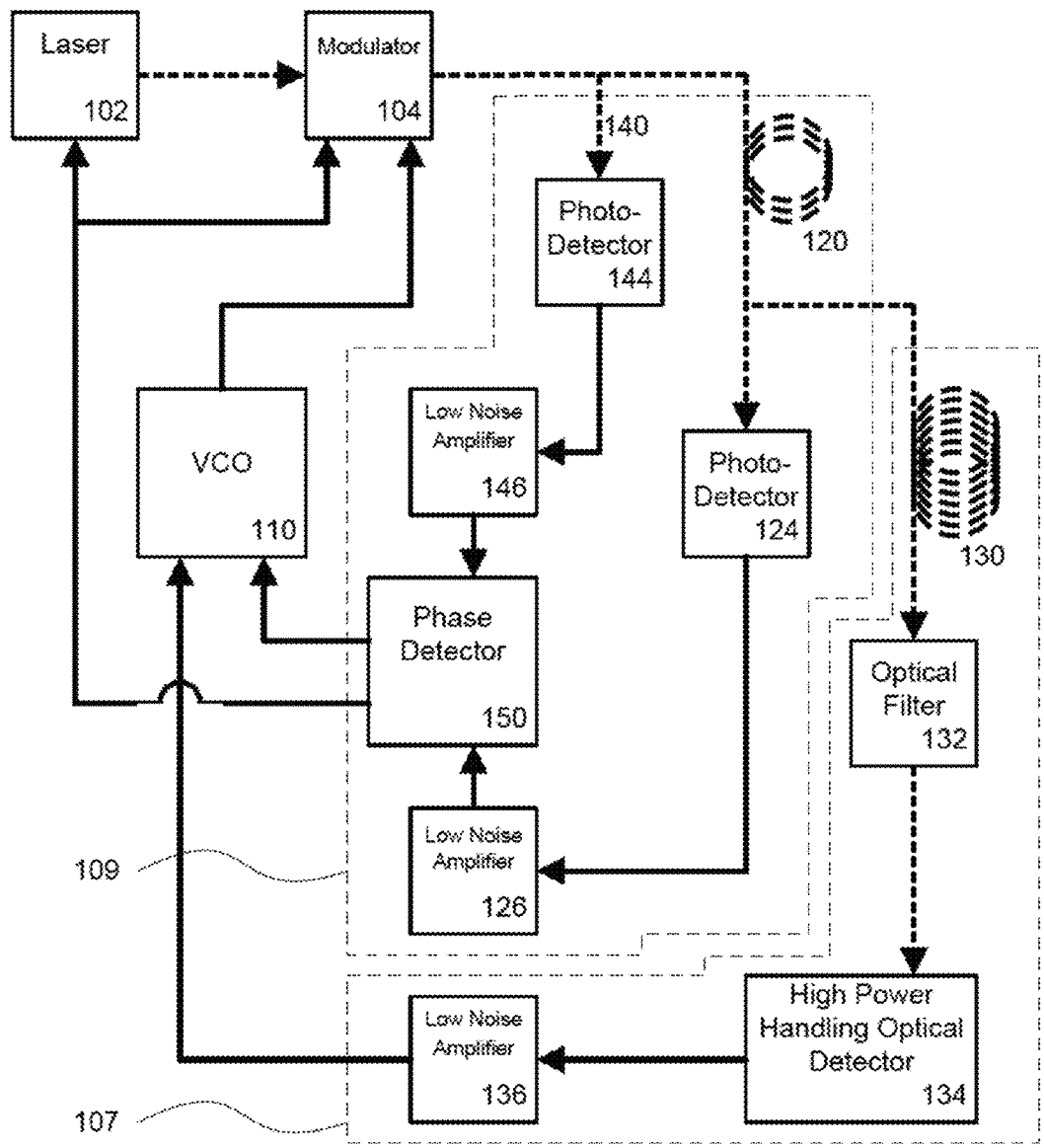
FIG. 9 is a block diagram depicting an optoelectronic oscillator in accordance with an aspect of the disclosure.

In other examples of the disclosure, the self injection locking component 107 and the self phase locked loop component 109 may not share a fiber optic delay line. For example, FIG. 5 depicts a block diagram of a configuration in which the self injection locking component 107 of the control and feedback circuitry 105 is separate from the self phase locked loop component 109. The configuration of FIG. 9 is slightly different from that of FIGS. 1 and 2 in that a third optical fiber cable 140 having a substantially smaller delay is included and is coupled to an input of the phase detector 150 via a photodetector 144 and amplifier 146. The second optical fiber cable 130 having a long delay is still utilized for purposes of injection locking and is coupled to an input of the VCO 110 (e.g., input port I).

In some examples of the disclosure, multiple fiber optic delay lines may be used in order to increase the feedback delay time τ. For example, in the oscillator configuration depicted in FIG. 2, the two fiber optic delay lines are fed into the phase detector 150. One of the fiber optic delay lines may be a short delay fiber 120 (about fps delay for a 200 meter fiber) and the other may be a long delay fiber 130 (about 5 μs delay for a 1 kilometer fiber, about 50 μs delay for a 10 kilometer fiber). Phase comparison of the two delay lines may reduce close-in carrier phase noise of the oscillating optical signal.

In some examples of the disclosure not shown in the figures, three or more fiber optic delay lines may be combined (e.g., successively) using a plurality of phase detectors in order to achieve greater stability of the oscillator through a further increased feedback delay time τ. Such examples may include a multiple frequency discriminator, which in turn may include at least two pieces of optical fiber inserted into one arm of a standard frequency discriminator. Also, in some examples, the self-PLL component may further include a low pass filter and amplifier coupled to the output of the phase detector 150. These components may be beneficial for further filtering out any higher frequencies having increased phase noise.

Turning last to the circuitry of the VCO 110, the VCO 110 may include a tunable bandpass filter 112 having five ports I-V. Port I may be configured for receiving an injection locking input from the self-IL component 107. Input port II may be configured for receiving a phase locked loop input from the self-PLL component 109. Port III configured for outputting an oscillating signal to an input of the modulator 104. As described above in connection with FIG. 1, the two inputs received at ports I and II may be used to control the stability of the oscillating signal outputted at port III.

In addition to the three ports described above, the tunable bandpass filter 112 may also be coupled, via ports IV and V, to a power amplifier 114 for amplification of the nucleating noise and generation of the free-running oscillating signal. The power amplifier 114 may amplify the injection locking input at port I, thereby enabling the tunable bandpass filter 112 to achieve a power output at port III of about 1 Watt or greater. Additionally, amplification of the injection locking input may increase the locking range of the oscillator without detrimentally increasing its phase noise.

Figure 10:
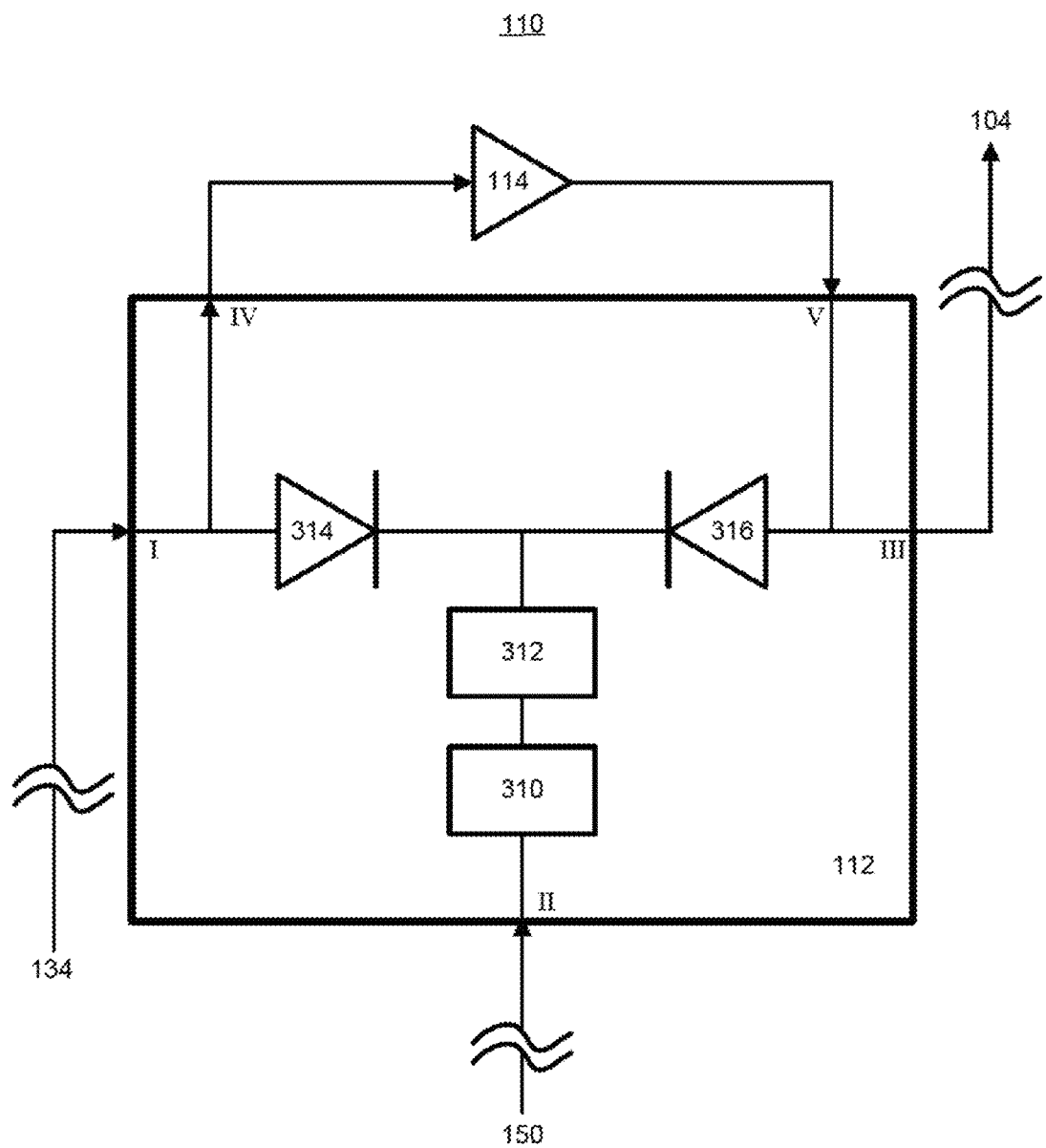
FIG. 10 is a graphical representation of data in accordance with an aspect of the disclosure.

FIG. 10 depicts the components of the tunable bandpass filter 112 of the VCO 110 in greater detail. The tunable bandpass filter 112 may include a pair of band pass filters 310 and 312 for additional filtering of the phase lock loop input received from the phase detector 150. The tunable bandpass filter 112 may also include a pair of antiparallel diodes 314 and 316 that function as a tunable varactor. As described above, the phase lock loop input acts as a voltage that tunes the effective capacitance of the diodes 314 and 316. Tuning the effective capacitance of the diodes in turn affects the resonant frequency of the oscillating signal produced by the VCO 110. Further to the tuning performed by the phase lock loop input, an injection locking input received from the photodetector 136 of the self injection locking component may also control the frequency and phase of the oscillating signal generated by the VCO 110, as would a master oscillator control a slave oscillator in an ordinary injection locking configuration. The oscillating signal generated by the VCO 110 may be fed to the modulator 104 from a node between the power amplifier 114 and reverse biased varactor diode 316.

As shown in the example of FIG. 10, the phase detector 150, photodetector 136, and modulator 104 are not required to be directly linked to (i.e., with no other components in between) the input and output ports I-V of the VCO 110. Other components may be positioned in between in accordance with this disclosure. For example, a low pass filter and amplifier may be positioned between the phase detector 150 and VCO 110 such that the phase lock loop input is further filtered and amplified prior to entering the VCO 110. For further example, in those aspects in which the self injection locking component and the self phase lock loop component share some components, the injection locking input may pass through a radio frequency coupler, at which the injection locking input may be split, part of the split signal travelling to the phase detector 150 and part of the signal to the VCO 110.

Figure 11:
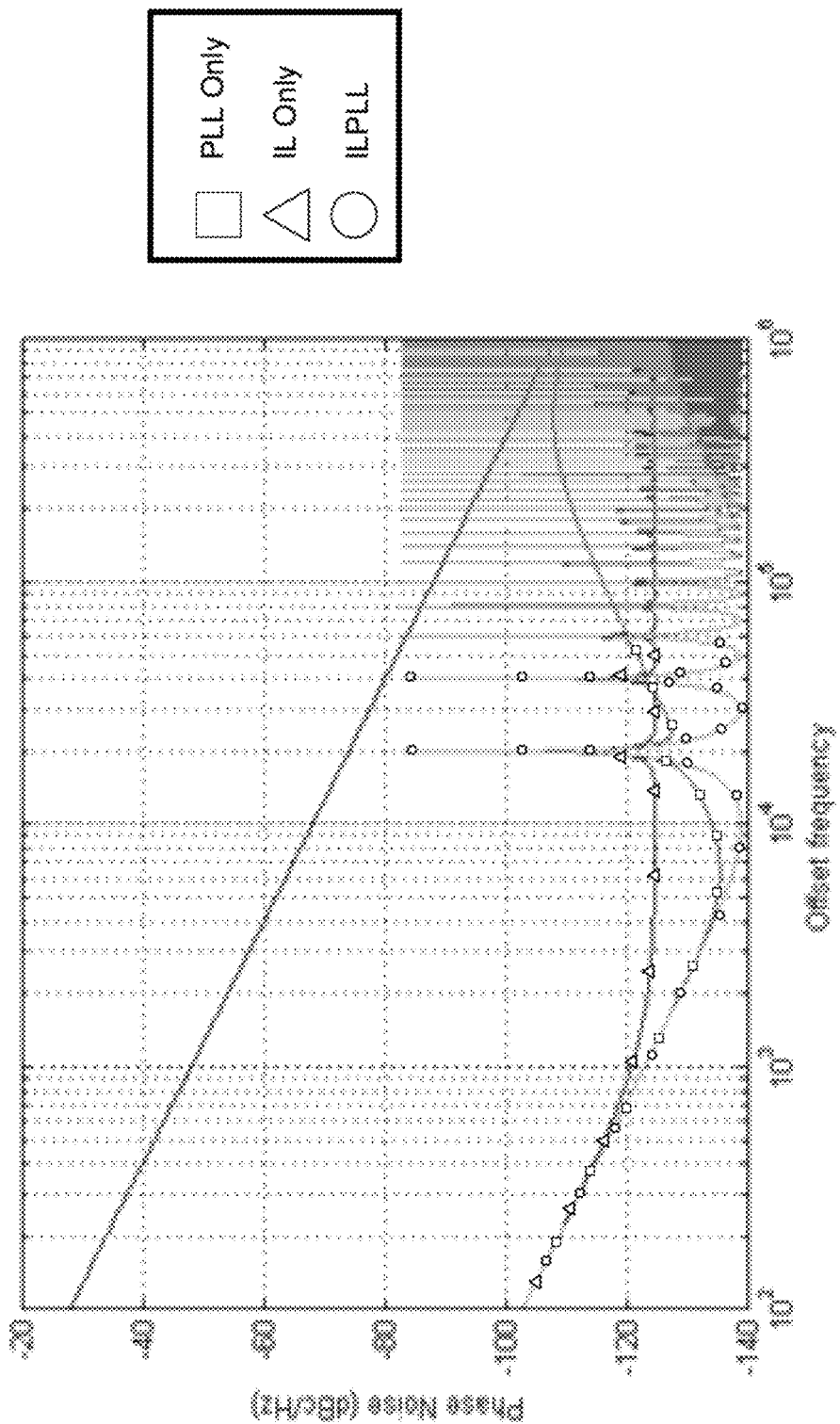
FIG. 11 is a graphical representation of data in accordance with an aspect of the disclosure.

The above description demonstrates the benefits yielded by each of the self-PLL and the self-IL components within the control and feedback circuitry 105. FIG. 11 graphically illustrates the benefits (with regard to phase noise reduction) yielded by combining these components within the control and feedback circuitry 105. Specifically, FIG. 11 shows the phase noise of an oscillator in which the VCO is locked directly to a 10 kilometer long cable, as compared to the phase noise in a self-PLL-only setup. The phase noise of the oscillator may be analytically modeled according to the following formula:

$$S_{ILPLL}(f') = \frac{S_{ref}(f')\Delta f^2 \cos^2(\phi_{detune}) + f'^2 S_{PLL}(f')}{f'^2 + \Delta f^2 \cos^2(\phi_{detune})}$$

where $S_{ref}(f')$ is the phase noise of the reference signal; of is the injection locking range; $\Phi_{detune}$ is the phase detuning between the local oscillator signal and a reference signal; f' is the offset frequency. $S_{PLL}$ is the phase noise of the oscillator when it is only phase locked to the reference signal. It should be noted that $S_{PLL}$ is given by the following formula:

$$S_{PLL}(f') = \frac{f_{n0}^4 S_{ref}(f') + f'^4 S_0(f')}{(f'^2 + f_{n0}^2)^2}$$

where $f_{n0}$ is the natural resonant frequency in the phase locked loop.

More particularly, FIG. 11 depicts performance of a 10 GHz VCO with Q of 100 locked to a loop of 10 kilometers. $S_{ref}$ is the phase noise of the 10 kilometer long optoelectronic oscillator and $S_{PLL}$ is the phase noise of the electrical oscillator when it is only phase-locked to the optoelectronic oscillator. Practical natural resonant frequency $f_{n0}$=500 kHz, locking range of $f_{lock}$=10 MHz, and phase detuning limit of $\Phi_{detune}$=45° is also considered to represent a frequency drift between the free-running VCO and the optoelectronic oscillator under realistic conditions.

Figure 12A:
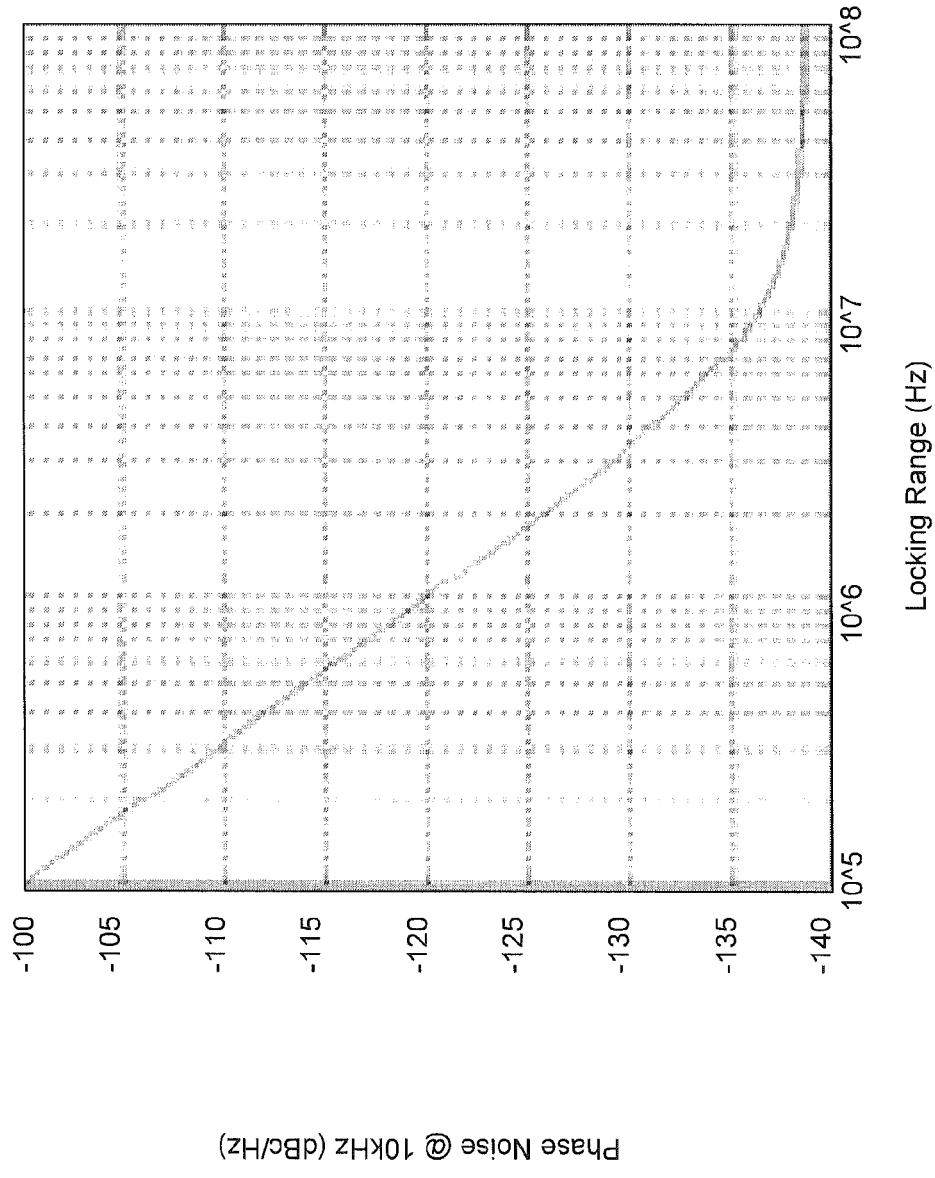
FIGS. 12a-12c are graphical representations of data in accordance with an aspect of the disclosure
Figure 12B:
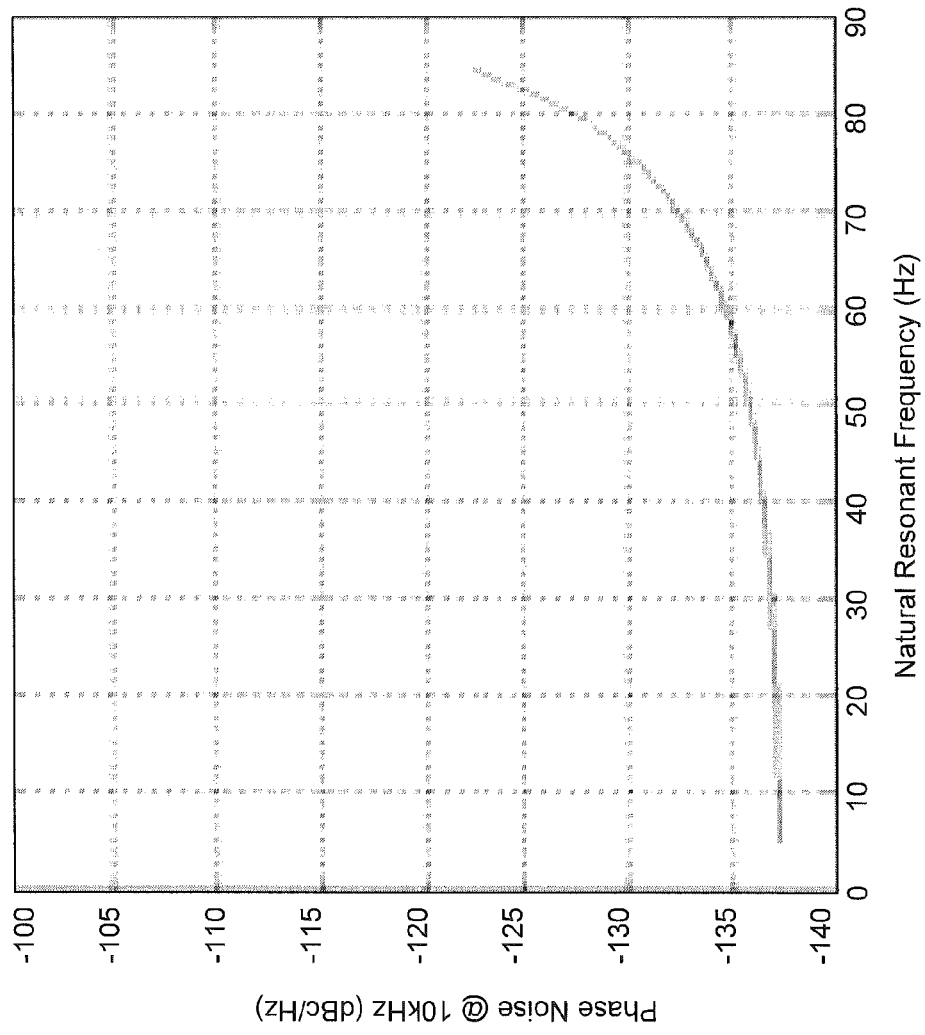
Figure 12C:
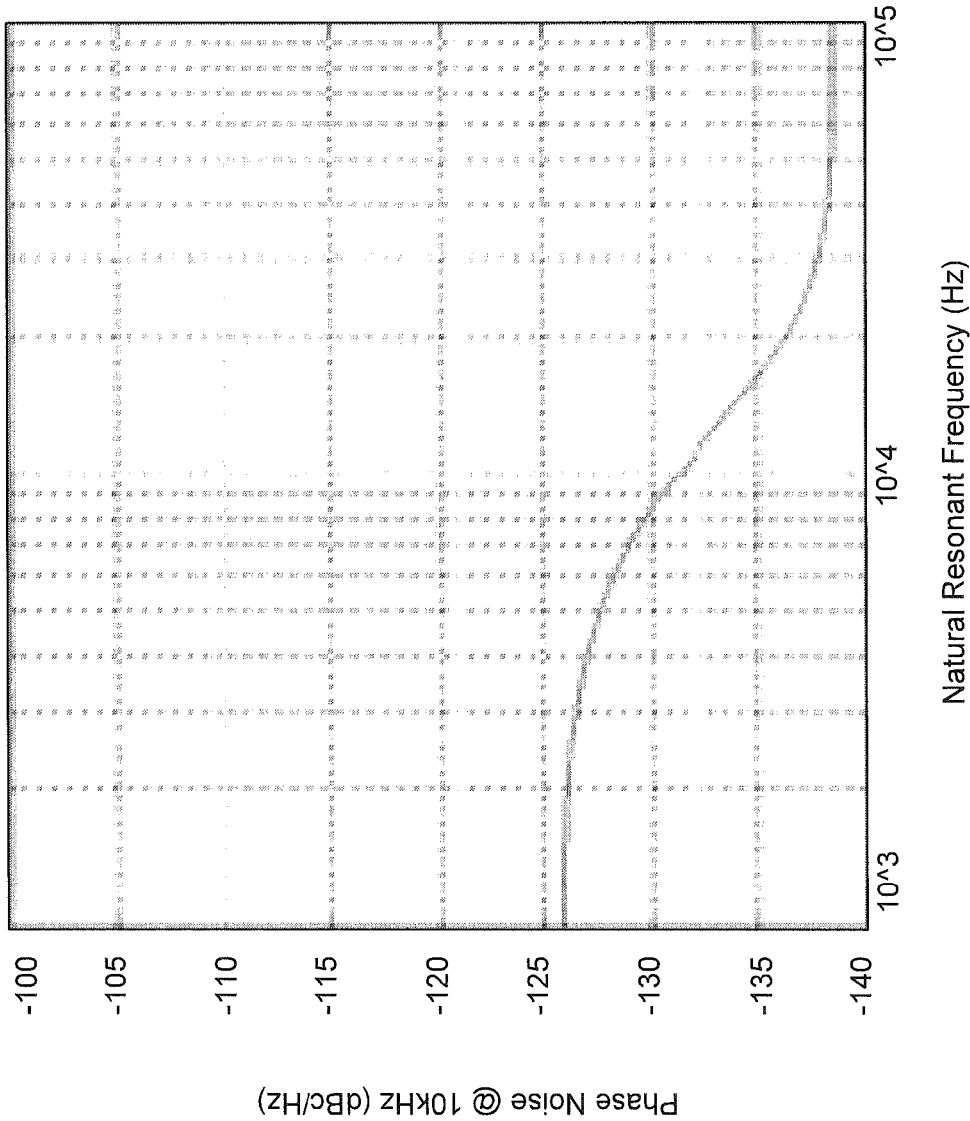

In the example of FIG. 11, a small phase detuning, high natural resonant frequency and high injection locking range are applied in order to achieve a substantial phase noise reduction. The impact of each of these parameters is further graphically illustrated in FIG. 12a-c. FIG. 12a demonstrates performance of the self injection locked self phase locked loop ("ILPLL") oscillator as locking range is increased, given $f_{n0}$=20 kHz and $\Phi_{detune}$=45°. FIG. 12b demonstrates performance of the ILPLL oscillator as phase detuning is modified, given a resonant natural frequency of $f_{n0}$=20 kHz and locking range of $f_{lock}$=10 MHz. Finally, FIG. 12c demonstrates performance of the impact of the natural resonance frequency on the ILPLL oscillator with a locking range of $f_{lock}$=10 MHz, and phase detuning of $\Phi_{detune}$=45°. An ILPLL optimum performance is expected for $f_{n0}$=50 kHz (i.e., an op-amp gain bandwidth of only 200 MHz), locking range of $f_{lock}$=20 MHz (i.e., a VCO Q factor of under 500), and $\Phi_{detune}$=5° (i.e., a VCO frequency drift of 5000 ppm/C).

In addition to the benefits of self-ILPLL feedback within the oscillator, additional benefits may be yielded through mode locking of the laser 102 and/or modulator 104 output. Such an oscillator configuration is shown in the example of FIG. 9. In this configuration, the output of the phase detector 150 may be used not only to control the effective capacitance of the VCO 110 but also adjusting operation points of either of the laser 102 and the modulator 104. Such operation point adjustment is applicable for both externally and directly modulated optical links, electro-absorption modulators, as well as for Mach-Zehnder modulators.

The optoelectronic oscillator of this disclosure may operate in accordance with the following description, which references the components described above in the example block diagrams of FIGS. 1a-1d, 2, and 9. The laser 102 may produce an optical beam that is fed into the modulator 104. In the modulator 104, an oscillating optical signal may be generated from the optical power. The modulator 104 may then output the RF modulated optical signal at the oscillating frequency to a fiber optic delay line 130. The optical signal may propagate over the fiber optic delay line 130 to an optical filter 132, where the phase noise of the optical signal is filtered out of the signal. The filtered optical signal may then be fed to a photodetector 134 that is coupled to an output of the optical filter 132, where the optical signal may be converted to an electrical signal. The converted electrical signal may then be fed to an input port of a VCO 110 as an injection locking input. In some examples, the converted electrical signal may pass through other electrical components, such as noise minimizing components (e.g., a low noise amplifier), en route to the VCO 110.

Additionally, the modulator 104 may output the RF modulated optical signal at the oscillating frequency to two or more optical fibers having different delay lengths. One these optical fibers may be the fiber optic delay line 130. As described in connection to the injection locking component, the temperature sensitivity of optical delay lines may be reduced by using passive temperature compensation, and losses in those fibers may also be reduced to extremely low levels by using a distributed optical Raman amplifier. Each optical signal may propagate over each of the respective fiber optic cables to respective optical filters 122 and 132, where the intensity noise of each optical signal may be filtered out and allow passing of select modes through optical transversal RF filter. The filtered RF modulated optical signals may then respectively be fed to photodetectors 124 and 134 that are respectively coupled to an output of an optical filter 122 and 132. As the wavelength of the optical source (i.e., laser 102) is adjusted, the center frequency of the optical filter may be adjusted using dispersive characteristics of optical fiber delays. At the photodetectors 124 and 134, each of the optical signals may be converted to an electrical signal. The converted electrical signals may then be fed to input ports of a phase detector or frequency discriminator 150, where the difference between the phase of the respective signals may be detected. In some examples, the converted electrical signals may pass through other electrical components, such as noise minimizing components (e.g., a low noise amplifier), en route to the phase detector 150. The phase detector 150 may then output a voltage, in response to the phase difference of the inputted electrical signals, which is fed to an input control port of the VCO 110 and used to adjust the effective capacitance of a component included in the tunable bandpass filter 112 of the VCO 110, such as varactor diodes, thereby phase locking the oscillation frequency. In some examples of the disclosure, the voltage outputted by the phase detector 150 may also be fed into the laser 102 (e.g., the control circuitry of laser 102) in order to control an operating condition of the laser 102, thereby performing optical mode locking in the laser 102. In yet further examples, the voltage outputted by the phase detector 150 may be fed into the modulator 104 in order to control an operating condition of the modulator 104, thereby performing optical mode locking in the modulator 104.

Returning to the VCO 110 and the input signals received there, the VCO 110 may generate a stable oscillating signal in response to the injection locking signal and the phase lock loop signal. The stable oscillating signal may then be fed via an output port V of the VCO 110 to the modulator 104. The stable oscillating signal may then be used by the modulator 104 to control the phase and frequency of the RF modulated optical signal at the oscillation frequency of the modulator 104. The oscillating RF signal outputted by the modulator may be significantly improved in terms of close-in to carrier phase noise using the above described control mechanisms and procedures.

The foregoing circuitry may be manufactured in small form factor. This may be done as either an electro-optic-polymer based Mach-Zehnder modulator, or using a long monolithically integrated laser with an electro-absorption modulator.

The foregoing circuitry may be employed in a myriad of applications. One such application is wireless data transmission. As the demand on wireless bandwidth increases it becomes even more important to use the available bandwidth more efficiently. In particular, systems will need to maintain signals at their required frequency and phase to prevent walkoff. An advantage of the present invention is that the signals output by the OEO are stable and operate at very low close-in to carrier phase noise levels. Thus, where the invention is employed in a base station, for example, system performance will improve and more users can be packed into the same bandwidth for example.

The invention may also be deployed in radar detection. In such systems, a stable signal allows for better precision in detecting the location of targets. The present invention advantageously allows for increasing the spatial and temporal resolution in such systems. In such systems, the circuitry may be employed in both the transmitter and/or receiver. As radar is deployed in a variety of applications including air traffic control, remote sensing, radio astronomy, spaceship docking and, in general, a variety of aerospace, environmental sensing, and military applications; the present invention may have far reaching impact in those applications.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An opto-electronic oscillation circuit for sustaining an oscillating optical signal, the circuit comprising:
    a self injection locking component configured to receive a first portion of the optical signal, and further comprising a fiber optic delay line over which the optical signal propagates;
    a self phase locked loop component configured to receive a second portion of the oscillating optical signal, and further comprising:
        at least two fiber optic cables over which the optical signal propagates, wherein the two fiber optic cables have different lengths and at least one of the fiber optic cables is a fiber optic delay line; and
        at least one phase detector coupled to the at least two fiber optic cables and configured to determine a difference in phase between a signal propagating over one of the fiber optic cables and a signal propagating over another of the fiber optic cables; and
    a voltage controlled oscillator configured to generate a stable oscillating signal in response to each of an injection locking signal generated by the self injection locking component and a phase locked loop signal generated by the self phase locked loop component, the stable oscillating signal being configured to RF modulate the optical signal.

2. The opto-electronic oscillation circuit of claim 1, wherein the voltage controlled oscillator comprises reverse biased varactor diodes having an effective variable capacitance, the stable oscillating signal being controlled at least in part by the effective capacitance of the reverse biased varactor diodes.

3. The opto-electronic oscillation circuit of claim 1, further comprising a noise minimizing component electrically coupled to the self injection locking component and the voltage controlled oscillator, the noise minimizing component configured to amplify the injection locking signal without adding substantial phase noise to the injection locking signal.

4. The opto-electronic oscillation circuit of claim 3, wherein the noise minimizing component is one of a degenerative feedback amplifier, a reactively matched differential amplifier, and a trans-impedance differential amplifier.

5. The opto-electronic oscillation circuit of claim 1, further comprising a mode locking component coupled to the phase detector and to a laser from which the optical signal originates, the mode locking component performing one of mode suppression, mode injection, mode coupling, mode combining, multi-mode injection coupling, and evanescent mode coupling techniques.

6. The opto-electronic oscillation circuit of claim 1, further comprising a mode locking component coupled to the phase detector and to an optical signal modulator from which the optical signal originates, the mode locking component performing one of mode suppression, mode injection, mode coupling, mode combining, multi-mode injection coupling, and evanescent mode coupling techniques.

7. The opto-electronic oscillation circuit of claim 1, wherein the fiber optic delay line of the self injection locking component is a photonic bandgap based fiber configured to exhibit a reversed dispersion slope.

8. The opto-electronic oscillation circuit of claim 7, wherein the fiber optic delay line of the self injection locking component further comprises a composite fiber, the composite fiber comprising each of a single mode optical fiber and a photonic crystal fiber, wherein each of the single mode optical fiber and the photonic crystal fiber have opposing temperature slopes.

9. The opto-electronic oscillation circuit of claim 8, wherein the ratio between the lengths of the single mode optical fiber and the photonic crystal fiber is about 1:8.

10. The opto-electronic oscillation circuit of claim 8, wherein the optical attenuation of the fiber optic delay line is about 0.05 dB/km or less.

11. The opto-electronic oscillation circuit of claim 7, wherein the self injection locking component further comprises a distributed Raman amplifier configured to inject pump optical power into the fiber optic delay line of the self injection locking component, the wavelength of the pump optical source being shorter than the wavelength of the optical signal propagating over the fiber optic delay line.

12. The opto-electronic oscillation circuit of claim 1, wherein the fiber optic delay line has a predetermined attenuation factor and effective refraction index, wherein the length of the fiber optic delay line is selected to yield a quality factor that is greater than the maximum quality factor for a fiber optic delay line having a length less than 1 km and the same attenuation factor and effective refraction index.

13. The opto-electronic oscillation circuit of claim 12, wherein the length of the fiber optic delay line is selected based on the following equation:

$$Q = \frac{\text{Total Phase Stored}}{\text{Total Loss}} = \frac{\pi f_{osc} \tau}{a^l}$$

14. The opto-electronic oscillation circuit of claim 12, wherein the fiber optic delay line receives pump optical power for distributed Raman amplification, and comprises a composite fiber including at least one single mode optical fiber or solid core photonic band-gap fiber and one hollow core photonic crystal fiber.

15. The opto-electronic oscillation circuit of claim 14, wherein the length of the fiber optic delay line is selected to compromise between short term and long term stability of the RF modulated oscillating optical signal.

16. The opto-electronic oscillation circuit of claim 15, wherein the fiber optic delay line is about 1 km long.

17. The opto-electronic oscillation circuit of claim 15, wherein the fiber optic delay line is about 10 km long.

18. The opto-electronic oscillation circuit of claim 1, wherein the self injection locking component further comprises an optical filter configured to filter the optical signal propagating over the fiber optic delay line of the self injection locking component.

19. The opto-electronic oscillation circuit of claim 18, wherein the optical filter comprises a Fabry-Perot etalon having a total loop length of about 10 meters, wherein the beat frequency of the Fabry-Perot etalon at least in part controls the oscillating frequency of the sustained optical signal.

20. The opto-electronic oscillation circuit of claim 18, wherein the optical filter comprises at least one optical transversal RF filter having an oscillation frequency derived using the following formula:

$$\cos^2(2\pi f \cdot \Delta t) = 1.$$

21. The opto-electronic oscillation circuit of claim 20, the optical filter further comprising at least a second optical transversal RF filter, the power of the optical signal being split by a first coupler at an input side of the first and second optical transversal RF filters and recombined by a second coupler at an output side of the filters, the first and second filters having a difference in fiber delay length.

22. The opto-electronic oscillation circuit of claim 21, wherein each of the first coupler and second coupler are tunable variable couplers capable of adjusting the wavelength of the optical signal.

23. The opto-electronic oscillation circuit of claim 21, wherein the optical power of the optical signal is split among each of the transversal filters evenly, and wherein the difference in the fiber optic delay lengths is selected based on the following formula: $L_N - L_1 = 2^{N-2} \Delta L$.

24. The opto-electronic oscillation circuit of claim 21, wherein the optical power of the optical signal is split among each of the transversal filters unevenly, and wherein the difference in the fiber optic delay lengths is selected based on the following formula: $L_N - L_1 = (N-1)\Delta L$.

25. The opto-electronic oscillation circuit of claim 20, wherein the transversal filter comprises at least one polarization-sensitive optical fiber over which two optical signals may propagate at differing speeds.

26. The opto-electronic oscillation circuit of claim 25, wherein the polarization-sensitive optical fiber has a length selected based on the following formula:

$$\Delta t = \frac{(n_1 - n_2) \cdot 1}{c}$$

27. The opto-electronic oscillation circuit of claim 1, wherein the phase detector comprises a comparator circuit configured to generate an analog voltage signal proportionate to a phase difference between two RF signals inputted to the phase detector, and wherein the analog voltage signal fluctuates in response to changes in either the frequency or phase of the optical signal propagating over the self phase lock loop component.

28. The opto-electronic oscillation circuit of claim 1, wherein the fiber delay line of the self injection locking component is the fiber delay line of the self phase locked loop component.

29. The opto-electronic oscillation circuit of claim 1, wherein the self phase lock loop component comprises at least three optical fibers, at least two of which are fiber optic delay lines, each of the fiber optic delay lines having a different delay length.

30. The opto-electronic oscillation circuit of claim 29, wherein the self phase lock loop component further comprises a multiple frequency discriminator configured to combine each of optical signals propagating over the respective optical fibers.

31. The opto-electronic oscillation circuit of claim 1, wherein the circuit has a locking range of $f_{lock}=20$ MHz, and a phase detuning of $\Phi_{detune}=5°$.

32. The opto-electronic oscillation circuit of claim 1, wherein the circuit has a natural resonance frequency of about $f_{n0}=50$ kHz or greater.

33. The opto-electronic oscillation circuit of claim 1, wherein the voltage controlled oscillator comprises a tunable bandpass filter, and a power amplifier configured to amplify the injection locking input, wherein the stable oscillating signal generated by the voltage controlled oscillator is outputted by the voltage controlled oscillator with about 1 watt or greater power.

34. An optoelectronic oscillator, comprising:
a modulator providing an optical signal;
a first optical filter for receiving a portion of the optical signal, the first optical filter having a output that is coupled to a first photodetector;
a second optical filter for receiving a portion of the optical signal, the second optical filter having a output that is coupled to a second photodetector;
a phase detector for receiving a first RF signal from the first photodetector and a second RF signal from the second photodetector with a longer delay than the first RF signal, the phase detector configured to determine a phase difference between the first and second RF signals; and
a voltage controlled oscillator for receiving one of the first electrical signal from the first photodetector and the second electrical signal from the second photodetector, and for receiving a third electrical signal from the phase detector, wherein the voltage controlled oscillator is configured to output an oscillating signal in response to both the one of the first and second RF signals and the third RF signal, and wherein the oscillating signal is used to control an output of the modulator.

35. The optoelectronic oscillator of claim 34, wherein the oscillating signal is used to RF modulate the optical signal provided by the modulator.

36. The optoelectronic oscillator of claim 34, further comprising at least one composite optical fiber comprising:
a single mode fiber or a solid core photonic bandgap (SC-PBG); and
a hollow-core photonic crystal fiber (HC-PCF).

37. The optoelectronic oscillator of claim 36, further comprising a distributed Raman amplifier, wherein the composite optical fiber is capable of having an attenuation of about 0.05 dB/km or less.

38. The optoelectronic oscillator of claim 34, further comprising a wavelength tunable laser source for changing a delay of at least a portion of the optical signal, and for changing the passband center frequency of the optical filter.

39. The optoelectronic oscillator of claim 34, further comprising a mode-locking component for stabilizing a plurality of modes of the optical signal provided by the modulator in phase with one another.

40. The optoelectronic oscillator of claim 34, wherein the oscillating signal is used to control one of a frequency and a phase of an RF modulated optical signal produced by the optoelectronic oscillator.

41. The optoelectronic oscillator of claim 34, wherein the portion of the light signal received by one of the first optical filter and the second optical filter is supplied through a fiber optic cable having a length that is at least about 1 kilometer.

42. The optoelectronic oscillator of claim 34, wherein the portion of the light signal received by one of the first optical filter and the second optical filter is supplied through a fiber optic cable having a length that is at least about 10 kilometers.

43. The optoelectronic oscillator of claim 34, wherein the voltage controlled oscillator includes a tunable bandpass filter and a power amplifier, the tunable bandpass filter being coupled to an input and an output of the power amplifier.

44. The optoelectronic oscillator of claim 34, where in the mode-locking is achieved by adjusting operation condition of laser source and modulator.

* * * * *